US010682728B2

(12) United States Patent
Priewasser et al.

(10) Patent No.: US 10,682,728 B2
(45) Date of Patent: Jun. 16, 2020

(54) METHOD OF PROCESSING A SUBSTRATE

(71) Applicant: DISCO Corporation, Tokyo (JP)

(72) Inventors: Karl Heinz Priewasser, Munich (DE); Hitoshi Hoshino, Munich (DE); Kenji Furuta, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/044,920

(22) Filed: Jul. 25, 2018

(65) Prior Publication Data

US 2019/0030648 A1   Jan. 31, 2019

(30) Foreign Application Priority Data

Jul. 26, 2017 (DE) .................. 10 2017 212 858

(51) Int. Cl.
| H01L 21/78 | (2006.01) |
| B23K 26/53 | (2014.01) |
| B23K 26/364 | (2014.01) |
| B23K 26/40 | (2014.01) |
| H01L 21/3065 | (2006.01) |

(52) U.S. Cl.
CPC ............ *B23K 26/364* (2015.10); *B23K 26/40* (2013.01); *B23K 26/53* (2015.10); *H01L 21/3065* (2013.01); *H01L 21/78* (2013.01)

(58) Field of Classification Search
CPC ... H01L 21/78; H01L 21/3065; H01L 21/304; H01L 21/3043; H01L 21/268; H01L 22/12; H01L 23/585; B23K 26/53; B23K 26/40; B23K 26/364; B23K 26/352
See application file for complete search history.

(56) References Cited

U.S. PATENT DOCUMENTS 9,165,832 B1 * 10/2015 Papanu .................. H01L 21/78
2006/0121697 A1    6/2006 Fujii et al.
(Continued)

FOREIGN PATENT DOCUMENTS

| JP | 2002205180 A | 7/2002 |
| JP | 2002319554 A | 10/2002 |
(Continued)

OTHER PUBLICATIONS

Machine translation of Azuma, Masayuki et al (JP 2007-214457) Aug. 23, 2007, 28 pages.*

(Continued)

*Primary Examiner* — Caridad Everhart
(74) *Attorney, Agent, or Firm* — Greer Burns & Crain Ltd.

(57) ABSTRACT

The invention relates to a method of processing a substrate. The substrate has on a first surface a device area with a plurality of devices partitioned by a plurality of division lines. A pulsed laser beam is applied to the substrate at least in a plurality of positions along each of the division lines, with a focal point located at a distance from the first surface in the direction from the first surface towards a second, opposite surface, so as to form a plurality of modified regions in the substrate along each of the division lines. The second surface of the substrate is then ground to adjust the substrate thickness. After forming modified regions and/or hole regions in the substrate, a plasma can be applied to the substrate so as to form a plurality of grooves extending along the division lines.

20 Claims, 11 Drawing Sheets

(56) References Cited

U.S. PATENT DOCUMENTS

| | | | |
|---|---|---|---|
| 2009/0117712 A1* | 5/2009 | Sakamoto | B28D 5/0011 |
| | | | 438/463 |
| 2011/0298084 A1 | 12/2011 | Tamemoto | |
| 2014/0017880 A1 | 1/2014 | Lei et al. | |
| 2015/0162244 A1 | 6/2015 | Holden et al. | |
| 2015/0228504 A1* | 8/2015 | Takesawa | H01L 24/03 |
| | | | 257/693 |
| 2016/0049348 A1* | 2/2016 | Zhao | H01L 21/568 |
| | | | 257/620 |
| 2016/0071767 A1* | 3/2016 | Hashimoto | H01L 21/78 |
| | | | 257/620 |
| 2016/0276223 A1 | 9/2016 | Priewasser | |
| 2018/0174908 A1* | 6/2018 | Karasaki | H01L 21/30655 |
| 2018/0197777 A1* | 7/2018 | Karasaki | B23K 26/062 |
| 2018/0281116 A1* | 10/2018 | Ogiwara | B23K 26/04 |

FOREIGN PATENT DOCUMENTS

| | | | | |
|---|---|---|---|---|
| JP | 2007214457 A | * | 8/2007 | B24B 7/228 |
| JP | 2009111147 A | | 5/2009 | |
| JP | 2011216913 A | | 10/2011 | |
| KR | 20160097268 A | | 8/2016 | |
| TW | 200306622 A | | 11/2003 | |
| TW | 201041027 A | | 11/2010 | |
| TW | 201409557 A | | 3/2014 | |

OTHER PUBLICATIONS

Translation of JP2002-319554 A (Kobayashi) (Oct. 31, 2002). (Year: 2002).*

* cited by examiner

METHOD OF PROCESSING A SUBSTRATE

TECHNICAL FIELD

The present invention relates to a method of processing a substrate, having a first surface and a second surface opposite the first surface, wherein the substrate has on the first surface a device area with a plurality of devices partitioned by a plurality of division lines.

TECHNICAL BACKGROUND

In a semiconductor device fabrication process, a plurality of crossing division lines (also referred to as "streets") are formed on the front side of a substantially disk-shaped semiconductor wafer, such as a silicon (Si) wafer, to thereby partition a plurality of regions where a plurality of devices, such as ICs and LSIs, are respectively formed. The devices are formed in a device area on the front side of the semiconductor wafer.

The semiconductor wafer is separated, e.g., cut, along the division lines to divide the separate regions where the devices are formed, thereby obtaining the individual devices as chips or dies.

This approach is adopted to obtain, for example, individual semiconductor devices, power devices, medical devices, electrical components or MEMS devices from substrates, such as single crystal substrates, glass substrates, compound substrates or polycrystalline substrates, with device areas in which these devices are formed.

If it is desired to maximise the number of devices which can be arranged on the substrate, such as a semiconductor wafer, i.e., the packing density of the devices, the widths of the division lines have to be decreased accordingly. For some substrates, the division line width may be 20 μm or less, e.g., for producing RFID chips or line sensors.

As a method of dividing a substrate, such as a semiconductor wafer, along the division lines, there has been proposed a laser processing method of applying a pulsed laser beam, having a wavelength allowing transmission of the beam through the substrate, to the substrate along the division lines in a condition where a focal point of the pulsed laser beam is located inside the substrate in a subject area to be divided. In this way, a modified layer having a reduced strength is continuously formed inside the substrate along each division line. Subsequently, an external force is applied to the substrate along each division line by using a breaking tool, thereby dividing the substrate into the individual devices as chips or dies. Such a method is disclosed in JP-A-3408805. Further methods in which a modified layer is formed inside a substrate by application of a laser beam and the modified layer is used as a starting point for dividing the substrate are taught in JP-A-2011-171382 and JP-A-2013-055120.

As another method of dividing a substrate, such as a semiconductor wafer, along the division lines, it has been proposed to apply a pulsed laser beam to the substrate in a condition where a focal point of the beam is located at a distance from the front side of the substrate in the direction towards the back side thereof, in order to create a plurality of hole regions in the substrate, such as a single crystal substrate. Each hole region is composed of an amorphous region and a space in the amorphous region open to the front side of the substrate. Subsequently, an external force is applied to the substrate along each division line by using a breaking tool, thus dividing the substrate into the individual devices as chips or dies.

Further, as yet another method of dividing a substrate, there has been proposed a laser processing method of applying a pulsed laser beam, having such a wavelength that it is absorbed by the substrate material, to the substrate along the division lines, so that the substrate is cut by laser ablation.

The fabrication processes referred to above often comprise a grinding step for adjusting the substrate thickness. The grinding step is performed from a back side of the substrate which is opposite to a substrate front side on which the device area is formed.

In particular, in order to achieve a size reduction of electronic equipment, the size of devices, such as semiconductor devices, power devices, medical devices, electrical components, MEMS devices or optical devices, has to be reduced. Hence, substrates having the devices formed thereon are ground in the above grinding step to thicknesses in the low μm range.

However, in known device fabrication processes, problems may arise when a pulsed laser beam, having a wavelength allowing transmission of the beam through the substrate, is applied to the back side of the substrate along the division lines in a condition where the focal point of the pulsed laser beam is located inside the substrate. In this case, the laser beam transmitted through the substrate may be at least partially incident on the devices formed in the device area on the front side of the substrate, thus causing damage to the devices.

Further, when such a pulsed laser beam is applied to the front side of the substrate after the substrate has been ground to a reduced thickness, e.g., in the low μm range, the substrate may be deformed due to substrate expansion caused by the formation of the modified layer inside the substrate. In particular, the substrate may warp, i.e., bend upwards or downwards. Thus, dividing the substrate along the division lines in a straight manner and accurately controlling the position of the focal point of the laser beam in the thickness direction of the substrate is rendered difficult or even entirely unfeasible.

These issues are particularly prominent for the case of substrates with narrow division lines, e.g., division lines having widths of 20 μm or less.

Moreover, in known device fabrication processes in which modified layers or hole regions are formed in a substrate by applying a laser beam thereto, the die strength of chips or dies obtained in the process of dividing the substrate may be reduced. In particular, the application of the laser beam may induce stress in the side walls of the resulting chips or dies, thus lowering the die strength.

The above-identified problems adversely affect the integrity of the chips or dies obtained from a substrate and can result in a significant reduction of device quality.

Hence, there remains a need for an efficient and reliable method of processing a substrate which allows for high quality chips or dies to be obtained.

SUMMARY OF THE INVENTION

Accordingly, it is an object of the present invention to provide an efficient and reliable method of processing a substrate which allows for high quality chips or dies to be obtained. This goal is achieved by a substrate processing method with the technical features of claim 1 and by a substrate processing method with the technical features of claim 12. Preferred embodiments of the invention follow from the dependent claims.

The invention provides, according to a first aspect, a method of processing a substrate, having a first surface and a second surface opposite the first surface. The substrate has on the first surface a device area with a plurality of devices partitioned by a plurality of division lines. The substrate has a thickness in the direction from the first surface towards the second surface of 100 µm or more. The method comprises applying a pulsed laser beam to the substrate, having a thickness of 100 µm or more, from the side of the first surface. The substrate is made of a material which is transparent to the pulsed laser beam. The pulsed laser beam is applied to the substrate at least in a plurality of positions along each of the division lines, in a condition where a focal point of the pulsed laser beam is located at a distance from the first surface in the direction from the first surface towards the second surface, so as to form a plurality of modified regions in the substrate along each of the division lines. The method further comprises grinding the second surface of the substrate to adjust the substrate thickness after forming the modified regions in the substrate.

The pulsed laser beam is applied to the substrate at least in a plurality of positions along each of the division lines, i.e., along the extension direction of each of the division lines.

The substrate is made of a material which is transparent to the pulsed laser beam. Thus, the plurality of modified regions is formed in the substrate by the application of a pulsed laser beam having a wavelength that allows transmission of the laser beam through the substrate.

For example, if the substrate is a silicon (Si) substrate, the pulsed laser beam may have a wavelength of 1.0 µm or more.

The pulsed laser beam may have a pulse width, for example, in the range of 1 ns to 700 ns, in particular, in the range of 1 ns to 300 ns.

In the method of the invention, the pulsed laser beam is applied to the substrate at least in a plurality of positions along each of the division lines. Hence, the modified regions are formed in the plurality of positions along each of the division lines.

According to the processing method of the invention, the pulsed laser beam is applied to the substrate from the side of the first surface at least in a plurality of positions along each of the division lines, so as to form a plurality of modified regions in the substrate along each of the division lines. By forming these modified regions, the strength of the substrate in the areas thereof where the modified regions are formed is reduced. Hence, division of the substrate along the division lines where the plurality of modified regions has been formed is greatly facilitated. In such a substrate division process, the individual devices provided in the device area of the substrate are obtained as chips or dies.

Subsequently, after forming the modified regions in the substrate, the second surface of the substrate is ground to adjust the substrate thickness. For example, the substrate thickness may be adjusted to the final thickness of the chips or dies to be obtained by dividing the substrate.

In the processing method of the invention, the pulsed laser beam is applied to the substrate from the side of the first surface, i.e., from the front side, of the substrate. Hence, incidence of the laser beam on the devices formed in the device area, as can occur when the laser beam is applied from the side of the second surface, i.e., from the back side, of the substrate due to transmission of the beam through the substrate, can be reliably avoided, thus preventing damage to the devices by the laser. While at least a portion of the laser beam may be transmitted through the substrate to the back side thereof, such laser transmission does not affect the quality of the chips or dies to be obtained from the substrate since the devices are arranged on the front side of the substrate.

Further, the pulsed laser beam is applied to the front side of the substrate before the substrate is ground, i.e., thinned, in a state in which the substrate has a thickness of 100 µm or more. Therefore, deformation of the substrate due to substrate expansion caused by the formation of the modified regions in the substrate is reliably prevented. By applying the laser beam to the substrate having a thickness of 100 µm or more, sufficient stability of the substrate against such deformation is achieved. In particular, it can be efficiently ensured that the substrate does not warp, i.e., bend upwards or downwards. Any curving or bending of the division lines resulting from substrate expansion is avoided. Thus, the method of the invention allows for the substrate to be divided along the division lines in a straight manner and for the position of the focal point of the laser beam in the thickness direction of the substrate to be accurately controlled.

Hence, the present invention provides an efficient and reliable method of processing a substrate which allows for high quality chips or dies to be obtained.

The substrate may have a thickness in the direction from the first surface towards the second surface of 150 µm or more, preferably 200 µm or more, more preferably 300 µm or more, even more preferably 400 µm or more, yet even more preferably 500 µm or more, and still even more preferably 600 µm or more. The pulsed laser beam may be applied to the substrate having a thickness of 150 µm or more, preferably 200 µm or more, more preferably 300 µm or more, even more preferably 400 µm or more, yet even more preferably 500 µm or more, and still even more preferably 600 µm or more.

As has been detailed above, the problems of known substrate processing methods are particularly prominent for the case of substrates with narrow division lines. Hence, the method of the present invention can be particularly advantageously used for such substrates. For example, the substrate to be processed by the method of the invention may have division lines with widths of 20 µm or less, preferably 18 µm or less, more preferably 15 µm or less, and even more preferably 12 µm or less.

When applying the pulsed laser beam to the substrate from the front side thereof in the method of the invention, the focal point of the pulsed laser beam may be located at a distance of 20 µm or less, preferably 15 µm or less, more preferably 12 µm or less, and even more preferably 10 µm or less, from the first surface in the direction from the first surface towards the second surface. In this way, any damage to the devices formed in the device area due to the laser beam can be particularly reliably avoided. In particular, in the vicinity of the focal point, the laser beam has a comparatively small beam diameter. By arranging the focal point in such close proximity to the first surface, it can be ensured that the diameter of the beam passing through the division lines between the devices is small, thereby reliably preventing incidence of a portion of the beam on the devices. This approach is particularly beneficial for processing substrates with narrow division lines.

The pulsed laser beam may be applied to the substrate at least in a plurality of positions along each of the division lines in such a manner that adjacent ones of the positions do not overlap each other.

The pulsed laser beam may be applied to the substrate at least in a plurality of positions along each of the division lines in such a manner that a distance between adjacent ones of the positions, i.e., a distance between centres of adjacent positions, is within a range of 3 µm to 50 µm, preferably 5 µm to 40 µm and more preferably 8 µm to 30 µm. The plurality of modified regions may be formed in the substrate so that a distance between centres of adjacent modified regions in the extension direction of each of the division lines is in the range of 3 µm to 50 µm, preferably 5 µm to 40 µm and more preferably 8 µm to 30 µm. Particularly preferably, the distance between centres of adjacent modified regions in the extension direction of each of the division lines is in the range of 8 µm to 10 µm.

The modified regions may be equidistantly spaced in the extension direction of each of the division lines. Alternatively, some or all of adjacent or neighbouring modified regions may have different distances from each other in the extension direction of each of the division lines.

The diameters of the modified regions may be substantially constant along the direction from the first surface towards the second surface of the substrate.

The modified regions may have diameters in the range of 1 µm to 30 µm, preferably 2 µm to 20 µm and more preferably 3 µm to 10 µm.

Particularly preferably, the modified regions may have diameters in the range of 2 µm to 3 µm.

The plurality of modified regions may be formed in the substrate so that adjacent or neighbouring modified regions do not overlap each other. In this way, it can be particularly reliably ensured that the substrate maintains a sufficient degree of strength or robustness for allowing efficient further handling and/or processing thereof, in particular, in the subsequent grinding step.

Preferably, the distance between outer edges of adjacent or neighbouring modified regions in the width direction of each of the division lines and/or in the extension direction of each of the division lines is at least 1 µm.

The plurality of modified regions may be formed in the substrate so that adjacent or neighbouring modified regions at least partially overlap each other. In some embodiments, adjacent or neighbouring modified regions only overlap each other along a part of the extension of the modified regions along the thickness direction of the substrate. For example, adjacent or neighbouring modified regions may only overlap each other along a part of the extension of the modified regions along the thickness direction of the substrate which is closer to the first surface of the substrate. Adjacent or neighbouring modified regions may be configured so as not to overlap each other along a part of the extension of the modified regions along the thickness direction of the substrate which is closer to the second surface of the substrate.

The modified regions may be formed so as to extend along only a part of the thickness of the substrate. Some or all of the modified regions may be formed so as to extend along 5% or more and 60% or less, preferably 10% or more and 40% or less, and more preferably 15% or more and 30% or less of the thickness of the substrate.

The amount of extension of the modified regions along the thickness of the substrate and the position of the modified regions along the thickness of the substrate can be accurately controlled, for example, by locating the focal point of the pulsed laser beam at an appropriate distance from the first surface in the direction from the first surface towards the second surface.

The pulsed laser beam may be applied to the substrate from the side of the first surface also in a plurality of positions along the width direction of each of the division lines.

A plurality of modified regions may be formed within the width of each of the division lines.

Adjacent or neighbouring modified regions may be equidistantly spaced in the width direction of each of the division lines. Alternatively, some or all of adjacent or neighbouring modified regions may have different distances from each other in the width direction of each of the division lines. The modified regions may be substantially randomly arranged in the extension direction and/or the width direction of each of the division lines.

The distances between adjacent modified regions in the width direction of each of the division lines, i.e., between centres of adjacent modified regions, may be in the range of 3 µm to 50 µm, preferably 5 µm to 40 µm and more preferably 8 µm to 30 µm.

The pulsed laser beam may be applied also in a plurality of positions along the width direction of each of the division lines, so as to form within the width of each of the division lines a plurality of rows of modified regions, each row extending along the extension direction of each of the division lines. The rows may be arranged adjacent to each other in the width direction of each of the division lines. The rows may be equidistantly spaced in the width direction of each of the division lines or some or all of adjacent rows may have different distances from each other in the width direction of each of the division lines.

The distance between adjacent rows of modified regions in the width direction of each of the division lines, i.e., between centres of the modified regions of the adjacent rows, may be in the range of 3 µm to 50 µm, preferably 5 µm to 40 µm and more preferably 8 µm to 30 µm. The number of rows may be in the range of 2 to 20, preferably 4 to 18, more preferably 5 to 15 and even more preferably 8 to 12.

By forming within the width of each of the division lines a plurality of rows of modified regions arranged adjacent to each other in the width direction of each of the division lines as detailed above, the process of dividing the substrate, e.g., by using a breaking process, applying an external force to the substrate, or a cutting process, such as a mechanical cutting process, a laser cutting process or a plasma cutting process, can be facilitated even further.

Alternatively, in a particularly preferred embodiment, a single row of modified regions may be formed within the width of each of the division lines. In this case, the method of the invention can be performed in a particularly quick and efficient manner.

The method of the invention may further comprise, before and/or after applying the pulsed laser beam to the substrate from the side of the first surface, applying a pulsed laser beam to the substrate, having a thickness of 100 µm or more, from the side of the second surface, i.e., from the back side of the substrate. The pulsed laser beam may be applied to the substrate at least in a plurality of positions along each of the division lines, in a condition where a focal point of the pulsed laser beam is located at a distance from the second surface in the direction from the second surface towards the first surface, so as to form a plurality of modified regions in the substrate along each of the division lines.

In particular, the pulsed laser beam may be applied to the substrate from the side of the second surface before applying the pulsed laser beam to the substrate from the side of the first surface.

The pulsed laser beam applied from the back side of the substrate may be the same pulsed laser beam as applied from the front side of the substrate or a different pulsed laser beam.

The modified regions formed by applying the pulsed laser beam from the back side of the substrate may be formed substantially in the same manner as the modified regions formed by applying the pulsed laser beam from the front side of the substrate.

The plurality of positions along each of the division lines in which the laser beam is applied may be the same or different ones for applying the laser beam from the front side and the back side of the substrate. Preferably, the positions are the same.

The pulsed laser beam is applied to the back side of the substrate before the substrate is ground, i.e., thinned, in a state in which the substrate has a thickness of 100 μm or more. Hence, the amount of laser light transmitted through the substrate is significantly reduced, so that any damage to the devices formed in the device area can be minimised.

As has been detailed above, by arranging the focal point in close proximity to the first surface when applying the laser beam from the front side of the substrate, incidence of a portion of the beam on the devices can be particularly reliably prevented, in particular, when processing substrates with narrow division lines. In this case, modified regions in areas of the substrate further away from the first surface can be formed by also applying the pulsed laser beam from the back side of the substrate. Hence, the substrate can be weakened more uniformly throughout its thickness by the formation of modified regions, thus further facilitating the process of dividing the substrate.

The method of the invention may further comprise, after grinding the second surface of the substrate, applying a pulsed laser beam to the substrate from the side of the ground second surface. The pulsed laser beam may be applied to the substrate at least in a plurality of positions along each of the division lines, in a condition where a focal point of the pulsed laser beam is located at a distance from the ground second surface in the direction from the ground second surface towards the first surface, so as to form a plurality of modified regions in the substrate along each of the division lines.

In this way, the process of dividing the substrate can be further facilitated.

Preferably, the pulsed laser beam applied from the side of the ground second surface of the substrate has a lower power than the pulsed laser beam applied from the side of the first surface of the substrate. In particular, the pulsed laser beam applied from the side of the ground second surface of the substrate may have a power, for example, in the range of about 0.3 to about 3.0 W. The pulsed laser beam applied from the side of the first surface of the substrate may have a power, for example, in the range of about 0.3 to about 8.0 W.

The method of the invention may further comprise, after grinding the second surface of the substrate, polishing and/or etching, e.g., dry etching and/or wet etching, the ground second surface.

By polishing, such as dry polishing or chemical mechanical polishing (CMP), and/or etching, such as plasma etching etc., the ground second surface, stress induced in the substrate can be removed, thereby further enhancing the die strength of the chips or dies obtained after dividing the substrate.

Particularly preferably, the pulsed laser beam is applied to the substrate from the side of the ground second surface after polishing the ground second surface. The polishing process provides a particularly smooth and even surface so that laser application can be controlled with an especially high degree of accuracy, in particular, with regard to the position of the focal point.

The method of the invention may further comprise, after grinding the second surface of the substrate, applying a plasma at least to the ground second surface.

For example, a plasma may be applied to the ground second surface of the substrate in order to remove, by plasma etching, stress induced in the substrate, as has been mentioned above.

Further, a plasma may be applied to the ground second surface so that the substrate is divided along the division lines, e.g., by plasma dicing. In this case, the substrate is fully divided in the plasma applying step.

Dividing the substrate into the separate dies or chips by applying a plasma thereto allows for narrow kerfs or cutting grooves to be formed between the dies or chips. In particular, the kerfs or cutting grooves obtained in this way are considerably narrower than those achievable by conventional blade dicing processes. Thus, the number of dies or chips obtainable from a single substrate can be significantly increased.

Moreover, the side walls of the resulting dies or chips can be plasma etched in the plasma applying step. No mechanical dicing stress is imparted to the dies or chips in the division process. Hence, the die strength of the dies or chips is further enhanced.

Also, in particular, for the case of small die sizes, the plasma division process is considerably faster than conventional blade or laser dicing approaches, thus further improving efficiency of the processing method. For example, the plasma division process allows for all division lines to be etched in a single pass.

Such a plasma division process can be applied particularly advantageously in the method of the invention, as will be further detailed below in relation to the second aspect of the present invention. Due to the formation of modified regions in the substrate, weakening the substrate, the plasma can remove the substrate material along the division lines in a particularly quick and efficient manner, thereby further facilitating the substrate division process.

In particular, in the modified regions, such as amorphous regions or regions in which cracks are formed, the substrate material can be removed more quickly by the plasma as compared to non-modified regions. Further, the modified regions can allow the plasma to enter into the substrate, thus further accelerating the plasma division process.

As has been detailed above, dividing the substrate along the division lines into the plurality of chips or dies may comprise applying a plasma to the substrate. The substrate may be divided along the division lines into the plurality of chips or dies by applying a plasma to the substrate.

The plasma may be applied to the substrate using a plasma applying means, such as a plasma chamber, a plasma source, a plasma torch or a plasma nozzle. Using a plasma chamber is particularly preferable.

In some embodiments, the plasma may be applied directly to the substrate, i.e., without employing a mask, e.g., by means of a plasma atmosphere, e.g., in a plasma chamber, or by means of a plasma beam, for example, using a plasma torch or a plasma nozzle. Applying the plasma by means of a plasma atmosphere is particularly preferable.

In other embodiments, the method may further comprise forming a mask on the ground second surface of the substrate before applying the plasma to the substrate.

The mask may be formed so as to leave uncovered the regions of the ground second surface of the substrate which lie opposite the division lines. The mask may be formed so as to substantially cover the entire ground second surface of the substrate but to leave uncovered only the regions of the ground second surface which lie opposite the division lines.

Forming the mask on the ground second surface of the substrate may include applying a cover layer, such as a resist layer, to this surface of the substrate and patterning the cover layer, e.g., by optical lithography or electron beam lithography. For example, the cover layer may be patterned by photolithography or lithography using a laser beam. Alternatively, the cover layer may be patterned in other known ways.

The plasma may be applied to the substrate on which the mask has been formed. For example, the substrate having the mask formed thereon may be placed in a plasma chamber and exposed or subjected to a plasma atmosphere. In this case, the plasma will react with the substrate material only in those areas of the substrate which are not covered by the mask, e.g., the regions of the ground second surface of the substrate which lie opposite the division lines. The plasma will remove the substrate material in these areas by plasma etching, thus dividing the substrate along the division lines into the individual dies or chips.

Subsequently, the mask may be removed from the separated dies or chips.

In the method of the invention, in each of the plurality of positions along each of the division lines where the pulsed laser beam or the pulsed laser beams is or are applied, plural modified regions may be formed, the plural modified regions being arranged next to one another along the direction from the first surface towards the second surface, i.e., along the thickness direction of the substrate.

For example, the plural modified regions may be two or more, three or more, four or more, five or more, or six or more modified regions.

By arranging plural modified regions next to one another in this manner, plural layers of modified regions can be formed, wherein the plural layers are stacked along the thickness direction of the substrate. Such a stack of layers of modified regions can extend over 30% or more, 40% or more, 50% or more, 60% or more, 70% or more, 80% or more, or 90% or more of the thickness of the substrate.

In each of the plurality of positions along each of the division lines where the plural modified regions are formed, a distance between an uppermost modified region in the direction from the second surface towards the first surface and the first surface may be in the range of 5 µm to 100 µm, preferably 10 µm to 50 µm, and/or a distance between a lowermost modified region in the direction from the second surface towards the first surface and the second surface may be in the range of 5 µm to 100 µm, preferably 10 µm to 50 µm.

By providing such a distance at the first surface and/or the second surface of the substrate, the die strength of the resulting chips or dies can be further improved.

The method of the invention may further comprise, before and/or after applying the pulsed laser beam to the substrate from the side of the first surface, applying a plasma resistant coating to the first surface. For example, the plasma resistant coating may be a water soluble coating or a different type of coating.

The plasma resistant coating provides reliable protection to the devices formed in the device area in a subsequent stress removal and/or dividing step by plasma application.

If the plasma resistant coating is applied to the first surface before applying the pulsed laser beam to the substrate from the side of the first surface, it is preferable to use a plasma resistant coating which is transparent to the pulsed laser beam.

The method of the invention may further comprise, after grinding the second surface of the substrate, dividing the substrate along the division lines. As has been detailed above, the process of dividing the substrate may be carried out in various ways, e.g., by adopting a breaking process, applying an external force to the substrate, for example, using an expansion tape, or by adopting a cutting or dicing process, such as a mechanical cutting or dicing process, a laser cutting or dicing process or a plasma cutting or dicing process. Further, also a combination of two or more of these processes may be employed.

Moreover, the substrate may be divided in the grinding process, as will be explained in further detail below.

The method may further comprise applying a plasma at least to the first surface of the divided substrate. In this way, stress induced in the substrate can be removed, thereby further enhancing the die strength of the chips or dies obtained after dividing the substrate. By applying a plasma resistant coating to the first surface prior to the application of the plasma, it can be reliably ensured that the devices of the chips or dies are protected from being damaged by the plasma.

Subsequently, after the application of the plasma, the plasma resistant coating may be removed from the chips or dies.

The modified regions formed in the method of the invention are regions of the substrate which have been modified by the application of the pulsed laser beam. For example, the modified regions may be regions of the substrate in which the structure of the substrate material has been modified by the application of the pulsed laser beam.

The modified regions may comprise amorphous regions or regions in which cracks are formed, or may be amorphous regions or regions in which cracks are formed. In particularly preferred embodiments, the modified regions comprise or are amorphous regions.

Each modified region may comprise a space, e.g., a cavity, inside the substrate material, the space being surrounded by an amorphous region or a region in which cracks are formed.

Each modified region may be composed of a space, e.g., a cavity, inside the substrate material and an amorphous region or a region in which cracks are formed surrounding the space.

If the modified regions comprise or are regions in which cracks are formed, i.e., cracks have been formed, the cracks may be microcracks. The cracks may have dimensions, e.g., lengths and/or widths, in the µm range. For example, the cracks may have widths in the range of 5 µm to 100 µm and/or lengths in the range of 100 µm to 1000 µm.

The substrate may be a single crystal substrate or a glass substrate or a compound substrate or a polycrystalline substrate.

The substrate may be a single crystal substrate or a compound substrate or a polycrystalline substrate, and the modified regions may comprise or be amorphous regions. The substrate may be a glass substrate, and the modified regions may comprise or be regions in which cracks, in particular, microcracks, are formed.

The substrate may be, for example, a semiconductor substrate, a glass substrate, a sapphire ($Al_2O_3$) substrate, a ceramic substrate, such as an alumina ceramic substrate, a quartz substrate, a zirconia substrate, a PZT (lead zirconate titanate) substrate, a polycarbonate substrate, an optical crystal material substrate or the like. Particularly preferably, the substrate is a semiconductor substrate, such as a semiconductor wafer.

In particular, the substrate may be, for example, a silicon (Si) substrate, a gallium arsenide (GaAs) substrate, a gallium nitride (GaN) substrate, a gallium phosphide (GaP) substrate, an indium arsenide (InAs) substrate, an indium phosphide (InP) substrate, a silicon carbide (SiC) substrate, a silicon nitride (SiN) substrate, a lithium tantalate (LT) substrate, a lithium niobate (LN) substrate, a sapphire ($Al_2O_3$) substrate, an aluminium nitride (AlN) substrate, a silicon oxide ($SiO_2$) substrate or the like.

The substrate may be made of a single material or of a combination of different materials, e.g., two or more of the above-identified materials.

The pulsed laser beam may be focused using a focusing lens. A numerical aperture (NA) of the focusing lens may be set so that the value obtained by dividing the numerical aperture of the focusing lens by the refractive index (n) of the substrate is in the range of 0.2 to 0.85. In this way, the modified regions can be formed in a particularly reliable and efficient manner.

The invention further provides, according to a second aspect, a method of processing a substrate, having a first surface and a second surface opposite the first surface. The substrate has on the first surface a device area with a plurality of devices partitioned by a plurality of division lines. The method comprises applying a pulsed laser beam to the substrate from the side of the first surface or the side of the second surface. The pulsed laser beam is applied to the substrate at least in a plurality of positions along each of the division lines so as to form a plurality of modified regions and/or a plurality of hole regions in the substrate along each of the division lines. The method further comprises, after forming the modified regions and/or the hole regions in the substrate, applying a plasma to the substrate so as to form a plurality of grooves or kerfs in the substrate extending along the division lines where the plurality of modified regions and/or the plurality of hole regions has been formed.

The substrate may have the composition, properties, characteristics and features described in detail above.

For example, the substrate may be a single crystal substrate or a glass substrate or a compound substrate or a polycrystalline substrate.

Particularly preferably, the substrate is a semiconductor substrate, such as a semiconductor wafer.

The thickness of the substrate to be processed by the method of the second aspect may be the same as that of the substrate to be processed by the method of the first aspect but is not particularly limited. The method of the second aspect may be applied to substrates with any thickness.

Further, the substrate material is not restricted to materials which are transparent to the pulsed laser beam.

In the method of the second aspect, the modified regions may be formed substantially in the same manner as for the method of the first aspect or in a different manner. The modified regions may have the compositions, arrangements, properties, characteristics and features described in detail above.

In the method of the second aspect, the plasma may be applied to the substrate substantially in the same manner, i.e., using the same or similar means, as for the method of the first aspect or in a different manner.

Particularly preferably, the plasma is applied to the substrate by exposing or subjecting the substrate to a plasma atmosphere, e.g., in a plasma chamber. This method constitutes a particularly simple and efficient approach, since no complicated tools, such as plasma torches or plasma nozzles, are required and no electrical potential has to be applied to the substrate.

The plasma is applied to the substrate so as to form a plurality of grooves in the substrate extending along the division lines, i.e., so that each groove extends along the extension direction of the division line at which it has been formed.

Due to the formation of modified regions and/or hole regions in the substrate by application of the pulsed laser beam, weakening the substrate, the plasma can remove substrate material along the division lines in a particularly quick and efficient manner, thereby efficiently and reliably forming the plurality of grooves.

In particular, in the modified regions and/or hole regions, the substrate material can be removed more quickly by the plasma as compared to non-modified regions and areas of the substrate where no hole regions are formed, in particular, if the modified regions and/or hole regions comprise, for example, amorphous regions or regions in which cracks are formed. Further, the modified regions and/or hole regions can allow the plasma to enter into the substrate, thus further accelerating the formation of the grooves.

Moreover, by applying the plasma to the substrate, the areas of the substrate which are damaged by the formation of the modified regions and/or hole regions are at least partly removed when forming the grooves, thus enhancing the quality of the chips or dies resulting from dividing the substrate. Also, stress induced in the substrate by the application of the pulsed laser beam can be removed by applying the plasma thereto, thereby further enhancing the die strength of the chips or dies obtained after dividing the substrate.

Hence, the second aspect of the invention provides an efficient and reliable method of processing a substrate which allows for high quality chips or dies to be obtained.

The grooves may be formed in the substrate so as to extend along the entire thickness of the substrate. In this case, the substrate is divided along the division lines into the chips or dies by the plasma application process.

Alternatively, the grooves may be formed in the substrate so as to extend along only part of the thickness of the substrate. For example, the grooves may be formed so as to extend along 20% or more, 30% or more, 40% or more, 50% or more, 60% or more, 70% or more, 80% or more, or 90% or more of the thickness of the substrate.

In this case, the process of dividing, i.e., fully dividing, the substrate may be carried out, for example, by adopting a breaking process, applying an external force to the substrate, e.g., using an expansion tape, or by adopting a cutting or dicing process, such as a mechanical cutting or dicing process or a laser cutting or dicing process. Further, also a combination of two or more of these processes may be employed.

Moreover, the substrate may be divided by grinding the second surface thereof.

The grooves may be formed in the substrate so as to extend, in the widthwise direction of the grooves, i.e., in the direction perpendicular to the extension direction of the grooves, along not more than 90%, not more than 80%, not more than 70%, not more than 60%, not more than 50%, not more than 40%, not more than 30%, not more than 20%, or not more than 10% of the width of the division lines.

The modified regions may have the compositions, arrangements, properties, characteristics and features described in detail above for the first aspect of the invention.

The plurality of hole regions may be formed in the substrate so that a distance between centres of adjacent hole regions in the extension direction of each of the division lines is in the range of 3 μm to 50 μm, preferably 5 μm to 40 μm and more preferably 8 μm to 30 μm. In particular, the distance between centres of adjacent hole regions in the extension direction of the at least one division line may be in the range of 8 μm to 10 μm.

The hole regions may be equidistantly spaced in the extension direction of each of the division lines. Alternatively, some or all of adjacent or neighbouring hole regions may have different distances from each other in the extension direction of each of the division lines.

The diameters of the hole regions may be substantially constant along the thickness direction of the substrate.

The hole regions may have diameters in the range of 1 μm to 30 μm, preferably 2 μm to 20 μm and more preferably 3 μm to 10 μm.

Particularly preferably, the hole regions may have diameters in the range of 2 μm to 3 μm.

The plurality of hole regions may be formed in the substrate so that adjacent or neighbouring hole regions do not overlap each other. In this way, it can be particularly reliably ensured that the substrate maintains a sufficient degree of strength or robustness for allowing efficient further handling and/or processing thereof, for example, in subsequent grinding and/or dividing steps.

The distance between outer edges of adjacent or neighbouring hole regions in the width direction of each of the division lines and/or in the extension direction of each of the division lines may be at least 1 μm.

The plurality of hole regions may be formed in the substrate so that adjacent or neighbouring hole regions at least partially overlap each other. In this way, the process of forming grooves in the substrate by plasma application can be rendered even more efficient.

In some embodiments, adjacent or neighbouring hole regions only overlap each other along a part of the extension of the hole regions along the thickness of the substrate. For example, adjacent or neighbouring hole regions may only overlap each other along a part of the extension of the hole regions along the thickness of the substrate which is closer to the surface of the substrate to which the hole regions are open. Adjacent or neighbouring hole regions may be configured so as not to overlap each other along a part of the extension of the hole regions along the thickness of the substrate which is closer to the surface of the substrate opposite to the surface of the substrate to which the hole regions are open.

Some or all of the hole regions may have a substantially cylindrical shape or a tapered shape.

Some or all of the hole regions may substantially have the shape of a cylinder with the longitudinal cylinder axis arranged along the thickness direction of the substrate. In this case, the diameters of the hole regions are substantially constant along the thickness direction of the substrate.

Some or all of the hole regions may have a tapered shape, wherein the hole regions taper along their extension along the thickness of the substrate. The hole regions may taper along the direction from the first surface towards the second surface of the substrate or from the second surface towards the first surface of the substrate. In this case, the diameters of the hole regions decrease in the direction from the first surface towards the second surface of the substrate or in the direction from the second surface towards the first surface of the substrate.

The pulsed laser beam may be applied to the substrate also in a plurality of positions along the width direction of each of the division lines.

A plurality of hole regions may be formed within the width of each of the division lines.

Adjacent or neighbouring hole regions may be equidistantly spaced in the width direction of each of the division lines. Alternatively, some or all of adjacent or neighbouring hole regions may have different distances from each other in the width direction of each of the division lines. The hole regions may be substantially randomly arranged in the extension direction and/or the width direction of each of the division lines.

The distances between adjacent hole regions in the width direction of each of the division lines, i.e., between centres of adjacent hole regions, may be in the range of 3 μm to 50 μm, preferably 5 μm to 40 μm and more preferably 8 μm to 30 μm.

The pulsed laser beam may be applied also in a plurality of positions along the width direction of each of the division lines, so as to form within the width of each of the division lines a plurality of rows of hole regions, each row extending along the extension direction of each of the division lines. The rows may be arranged adjacent to each other in the width direction of each of the division lines. The rows may be equidistantly spaced in the width direction of each of the division lines or some or all of adjacent rows may have different distances from each other in the width direction of each of the division lines.

The distance between adjacent rows of hole regions in the width direction of each of the division lines, i.e., between centres of the hole regions of the adjacent rows, may be in the range of 3 μm to 50 μm, preferably 5 μm to 40 μm and more preferably 8 μm to 30 μm. The number of rows may be in the range of 2 to 20, preferably 4 to 18, more preferably 5 to 15 and even more preferably 8 to 12.

By forming within the width of each of the division lines a plurality of rows of hole regions arranged adjacent to each other in the width direction of each of the division lines as detailed above, the process of forming grooves in the substrate by plasma application can be further facilitated.

Alternatively, in a particularly preferred embodiment, a single row of hole regions may be formed within the width of each of the division lines. In this case, the method of the invention can be performed in a particularly quick and efficient manner.

The pulsed laser beam may be applied to the substrate from the side of the first surface. The pulsed laser beam may be applied to the substrate in a condition where a focal point of the pulsed laser beam is located on the first surface or a focal point of the pulsed laser beam is located at a distance from the first surface in the direction from the first surface towards the second surface, i.e., inside the bulk of the substrate, or a focal point of the pulsed laser beam is located at a distance from the first surface in the direction opposite to the direction from the first surface towards the second surface. In this latter case, the pulsed laser beam is applied to the substrate in a condition where the focal point of the pulsed laser beam is located at a distance from the first surface in the direction from the first surface away from the second surface. Thus, the focal point of the pulsed laser beam is located outside the bulk of the substrate.

The pulsed laser beam may be applied to the substrate from the side of the second surface. The pulsed laser beam may be applied to the substrate in a condition where a focal point of the pulsed laser beam is located on the second surface or a focal point of the pulsed laser beam is located at a distance from the second surface in the direction from the second surface towards the first surface, i.e., inside the bulk of the substrate, or a focal point of the pulsed laser beam is located at a distance from the second surface in the direction opposite to the direction from the second surface towards the first surface. In this latter case, the pulsed laser beam is applied to the substrate in a condition where the focal point of the pulsed laser beam is located at a distance from the second surface in the direction from the second surface away from the first surface. Thus, the focal point of the pulsed laser beam is located outside the bulk of the substrate.

For forming a plurality of modified regions in the substrate along each of the division lines by the application of the laser beam, it is preferred to arrange the laser beam so that the focal point thereof is located inside the bulk of the substrate. In this case, the substrate is made of a material which is transparent to the pulsed laser beam. Thus, the plurality of modified regions is formed in the substrate by the application of a pulsed laser beam having a wavelength that allows transmission of the laser beam through the substrate.

For forming a plurality of hole regions in the substrate along each of the division lines by the application of the laser beam, the laser beam may be arranged so that the focal point thereof is located on the first surface, on the second surface, inside the bulk of the substrate or outside the bulk of the substrate.

The substrate may be made of a material which is transparent to the pulsed laser beam. In this case, the plurality of hole regions is formed in the substrate by the application of a pulsed laser beam having a wavelength that allows transmission of the laser beam through the substrate.

The substrate may be made of a material which is not transparent, i.e., opaque, to the pulsed laser beam. The plurality of hole regions may be formed in the substrate by the application of a pulsed laser beam having such a wavelength that it is absorbed by the substrate material. In this case, the hole regions are formed by laser ablation. This approach is particularly efficient for processing a silicon carbide (SiC) substrate, such as a SiC wafer.

In the method of the invention, the pulsed laser beam and the plasma may be applied to the substrate from the same side of the substrate or from opposite sides of the substrate. For example, the pulsed laser beam and the plasma may be applied from the side of the first surface or from the side of the second surface. Alternatively, the pulsed laser beam may be applied from the side of the first surface and the plasma may be applied from the side of the second surface or vice versa.

The modified regions may comprise amorphous regions or regions in which cracks are formed, or the modified regions may be amorphous regions or regions in which cracks are formed, as has been detailed above for the method of the first aspect.

Each of the hole regions may be composed of a modified area and a space in the modified area open to the side of the surface of the substrate from which the pulsed laser beam is applied.

The modified area of each hole region is a region of the substrate which has been modified by the application of the pulsed laser beam. For example, the modified area may be an area of the substrate in which the structure of the substrate material has been modified by the application of the pulsed laser beam.

The modified area may comprise or be an amorphous area or an area in which cracks are formed. In particularly preferred embodiments, the modified area comprises or is an amorphous area.

If the modified area is an area in which cracks are formed, i.e., cracks have been formed, the cracks may be microcracks. The cracks may have dimensions, e.g., lengths and/or widths, in the μm range. For example, the cracks may have widths in the range of 5 μm to 100 μm and/or lengths in the range of 100 μm to 1000 μm.

In each of the plurality of positions along each of the division lines where the pulsed laser beam is applied, plural modified regions may be formed, the plural modified regions being arranged next to one another along the thickness direction of the substrate.

For example, the plural modified regions may be two or more, three or more, four or more, five or more, or six or more modified regions.

By arranging plural modified regions next to one another in this manner, plural layers of modified regions can be formed, wherein the plural layers are stacked along the thickness direction of the substrate. Such a stack of layers of modified regions can extend over 30% or more, 40% or more, 50% or more, 60% or more, 70% or more, 80% or more, or 90% or more of the thickness of the substrate.

In this way, the process of forming grooves in the substrate by applying the plasma thereto can be further facilitated.

In the method of the invention, by forming the plurality of modified regions and/or the plurality of hole regions in the substrate along each of the division lines, a plurality of openings may be formed in the substrate along each of the division lines, each opening being open to the side of the surface of the substrate from which the pulsed laser beam is applied or being open to the side of the surface of the substrate which is opposite to the side of the surface of the substrate from which the pulsed laser beam is applied.

For example, hole regions may be formed in the substrate, wherein the hole regions comprise spaces in the substrate which are open to the side of the surface of the substrate from which the pulsed laser beam is applied. In this case, the openings are provided by these spaces.

Further, the formation of the plurality of modified regions in the substrate along each of the division lines may cause the generation of the plurality of openings in the substrate along each of the division lines. In particular, forming the modified regions in the substrate may induce stress or strain in the substrate in the vicinity of the modified regions, resulting in the formation of cracks extending from the modified regions, in particular, towards one or both of the first and second surfaces of the substrate. These cracks do not form part of the modified regions but rather originate from the modified regions. Specifically, the cracks are not directly created by a structural modification of the substrate material induced by the application of the pulsed laser beam.

The cracks formed in this manner may reach one or both of the first and second surfaces of the substrate, thus providing an opening or openings in the respective substrate surface or surfaces.

Further, the modified regions may be formed so that also cracks at least substantially extending along the extension directions of the division lines originate from the modified regions. In this case, the modified regions may be provided along each of the division lines so that they are arranged at a distance from each other in the extension direction of the respective division line but connected with each other through the cracks extending therefrom.

As has been detailed above, in each of the plurality of positions along each of the division lines where the pulsed laser beam is applied, plural modified regions may be formed, the plural modified regions being arranged next to one another along the thickness direction of the substrate. In each of these positions, the modified regions may be provided so that they are arranged at a distance from each other in the thickness direction of the substrate but connected with each other through the cracks extending therefrom.

The cracks originating from the modified regions may extend in the thickness direction of the substrate to the side of the surface of the substrate from which the pulsed laser beam is applied or to the side of the surface of the substrate which is opposite to the side of the surface of the substrate from which the pulsed laser beam is applied or to both of these sides, thus forming openings which are open to the respective sides of the substrate.

Crack formation and propagation may be controlled, for example, by suitably controlling the arrangement of the focal point of the laser beam, the wavelength of the laser beam, the power of the laser beam and/or the pulse length of the laser beam. For example, in order to provide a crack reaching the first surface of the substrate, it is preferable to arrange the focal point, and thus also the modified region from which the crack extends, in proximity to the first surface.

The plasma may be applied to the side of the surface of the substrate to which the openings formed in the substrate along each of the division lines are open.

In this way, it can be reliably and efficiently ensured that the plasma can enter into the substrate through the openings, thus further accelerating the formation of plasma grooves in the substrate.

It is particularly preferable that adjacent or neighbouring modified regions in the thickness direction of the substrate and/or in the extension directions of the division lines are connected to each other through the cracks extending therefrom. In this way, the process of forming the grooves in the substrate by application of the plasma can be rendered even more efficient. In particular, if adjacent or neighbouring modified regions in the thickness direction of the substrate are connected to each other through the cracks extending therefrom, it can be reliably ensured that the plasma can enter deeply into the substrate.

However, it is not necessary that the cracks originating from the modified regions extend all the way to the surface of the substrate to which the plasma is applied. For example, the plasma may remove the surface layers of substrate material covering the cracks, thereby exposing the cracks to the outside of the substrate, and subsequently enter into the substrate through the exposed cracks.

The method of the invention may further comprise grinding the second surface of the substrate to adjust the substrate thickness before and/or after forming the modified regions and/or the hole regions in the substrate.

Grinding the second surface of the substrate may be performed after forming the modified regions and/or the hole regions in the substrate and before and/or after applying the plasma to the substrate.

Particularly preferably, the second surface of the substrate is ground after forming modified regions in the substrate and before applying the plasma to the substrate. In this way, the propagation of cracks extending from the modified regions, in particular, in the thickness direction of the substrate, can be promoted. Specifically, due to the stress exerted on the substrate in the grinding process, cracks created by the formation of the modified regions may propagate further, e.g., so as reach one or both of the first and second surfaces of the substrate. Since the grinding step is performed prior to applying the plasma to the substrate, it can be ensured that the plasma can enter into the substrate through the openings thus created.

As has been detailed above, the grooves formed in the substrate by applying the plasma to the substrate may extend along only part of the thickness of the substrate. Grinding the second surface of the substrate may be performed after applying the plasma to the substrate, and the substrate may be divided along the division lines by grinding the second surface of the substrate.

In particular, the grinding step may be carried out in such a way as to reduce the substrate thickness to a thickness that corresponds to the depth of the grooves formed by plasma application. In this case, the substrate material which had not been reached by the plasma grooving process is removed in the grinding step, so that the substrate is divided along the division lines by the grinding process.

By dividing the substrate in the grinding step in the manner detailed above, the substrate can be processed in a particularly reliable, accurate and efficient manner. Specifically, the step of applying the plasma to the substrate is performed on the substrate before grinding, i.e., before a reduction in thickness thereof. Hence, handling of the wafer in the plasma application step is facilitated.

According to a first possible approach, the method of the invention may comprise applying the pulsed laser beam to the substrate from the side of the first surface, which is particularly preferable. The laser application step may be followed by grinding the second surface of the substrate to adjust the substrate thickness. Subsequently, after grinding the second surface, the plasma may be applied to the substrate from the side of the ground second surface so as to form the plurality of grooves in the substrate along the division lines. The substrate may be divided in the plasma application step. Alternatively, the substrate may be divided in a separate subsequent step, e.g., by adopting a breaking process, applying an external force to the substrate, e.g., using an expansion tape, or by adopting a cutting or dicing process, such as a mechanical cutting or dicing process or a laser cutting or dicing process. Further, also a combination of two or more of these processes may be employed.

This first approach is particularly advantageous for processing substrates with narrow division lines, e.g., division lines having widths of 20 μm or less.

If the first approach is applied to substrates having on the division lines a metal layer, a layer of material which may affect application of the laser beam, e.g., a layer made of a material which is not transparent to the pulsed laser beam, and/or a layer which may affect the process of dividing the substrate along the division lines, the approach may be modified by performing an additional laser grooving step prior to applying the pulsed laser beam to the substrate from the side of the first surface. In this laser grooving step, which is also carried out from the side of the first surface, the respective layer is at least partly removed from the division lines.

According to a second possible approach, the first approach or the modified first approach may be further modified by applying the pulsed laser beam to the substrate from the side of the second surface thereof, rather than from the side of the first surface. This second approach may be applied particularly advantageously to substrates with wider division lines, e.g., division lines having widths of more than 20 μm.

The second possible approach may be modified by switching the order of the pulsed laser beam application and grinding steps, so that the second surface of the substrate is ground first, e.g., after the lasing grooving step, followed by the application of the pulsed laser beam.

According to a third possible approach, the first approach or the modified first approach may be further modified by applying a pulsed laser beam to the substrate from the side of the second surface thereof, after applying the pulsed laser beam to the substrate from the side of the first surface and before grinding the second surface of the substrate. This third approach is particularly advantageous for processing substrates with a relatively large thickness. In such cases, by applying a pulsed laser beam to the substrate also from the side of the second surface thereof, modified regions and/or hole regions can be particularly efficiently formed throughout the thickness of the substrate.

According to a fourth possible approach, the method of the invention may comprise applying the pulsed laser beam to the substrate from the side of the first surface. The laser application step may be followed by applying the plasma to the substrate from the side of the first surface so as to form the plurality of grooves in the substrate along the division lines. Subsequently, after applying the plasma to the substrate, the second surface of the substrate may be ground to adjust the substrate thickness. The substrate may be divided in the grinding step. Alternatively, the substrate may be divided in a separate subsequent step, e.g., by adopting a breaking process, applying an external force to the substrate, e.g., using an expansion tape, or by adopting a cutting or dicing process, such as a mechanical cutting or dicing process or a laser cutting or dicing process or a plasma cutting or dicing process. Further, also a combination of two or more of these processes may be employed.

The fourth approach may further comprise a step of applying a plasma resistant coating to the first surface, e.g., prior to applying the pulsed laser beam to the substrate from the side of the first surface.

If the fourth approach is applied to substrates having on the division lines a metal layer, a layer of material which may affect application of the laser beam, e.g., a layer made of a material which is not transparent to the pulsed laser beam, and/or a layer which may affect the process of dividing the substrate along the division lines, the approach may be modified by performing an additional laser grooving step prior to applying the pulsed laser beam to the substrate from the side of the first surface. In this laser grooving step, which is also carried out from the side of the first surface, the respective layer is at least partly removed from the division lines. For example, the laser grooving step may be performed after the optional step of applying a plasma resistant coating to the first surface.

This fourth approach may be applied advantageously to substrates with narrow division lines and substrates with wider division lines. Thus, there are substantially no restrictions with regard to the widths of the division lines of the substrates to be processed.

According to a fifth possible approach, the fourth approach may be modified by performing a dicing step from the side of the second surface of the substrate, after applying the plasma to the substrate from the side of the first surface and before grinding the second surface of the substrate. This dicing step may be, for example, a mechanical dicing step, such as a blade or saw dicing step, a laser dicing step, a plasma dicing step or a combination of two or more of these steps. Particularly preferably, the dicing step is a mechanical dicing step, such as a blade or saw dicing step.

In the dicing step, grooves or kerfs are formed in the substrate from the side of the second surface thereof. These grooves or kerfs are formed with such a depth that they reach the bottoms of the grooves or kerfs formed from the front side in the plasma application step. Thus, the substrate is divided along the division lines by the dicing step. If portions of the substrate are damaged, e.g., chipped, in the dicing process, the damaged portions can be removed in the subsequent grinding step.

The fifth approach may be modified by switching the order of the dicing and grinding steps, so that the grinding step is performed before the dicing step.

According to a sixth possible approach, the fifth approach may be modified by performing an additional grinding step, i.e., a pre-grinding step, from the side of the second surface of the substrate, after the plasma application step and before the dicing step. This approach is particularly advantageous if the dicing step is a mechanical dicing step, such as a blade or saw dicing step. In this case, by reducing the thickness of the substrate in the pre-grinding step, a mechanical dicing means, such as a blade or a saw, with a smaller width, as compared to a process in which no pre-grinding is performed, can be used, thus facilitating the dicing process.

According to a seventh possible approach, the fourth approach may be modified by changing the order of the processing steps, i.e., by performing the step of grinding the second surface of the substrate first, before applying the pulsed laser beam to the substrate from the side of the first surface and before the optional steps of applying a plasma resistant coating to the first surface and laser grooving.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods of processing a semiconductor device wafer as an example of a substrate.

The semiconductor device wafer has a thickness before grinding of 100 µm or more, preferably in the range of 200 µm to 1500 µm and more preferably in the range of 700 µm to 1000 µm.

Figure 1:
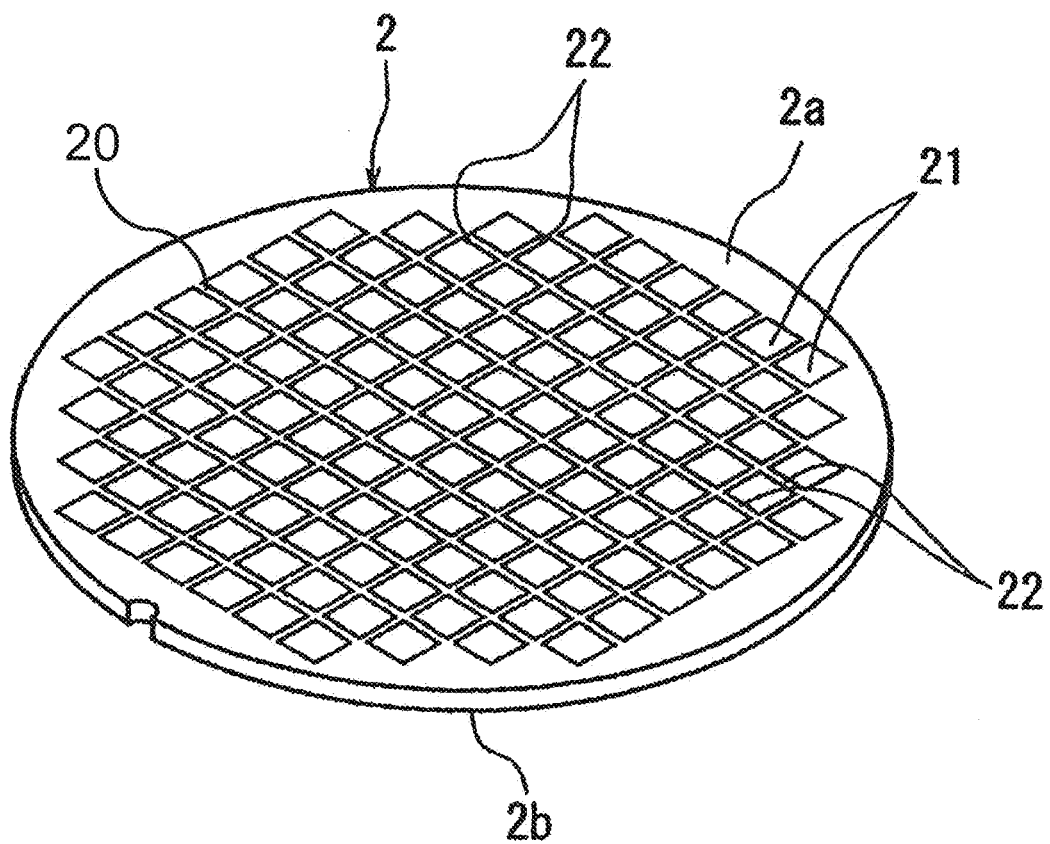
FIG. 1 is a perspective view showing a semiconductor device wafer as a substrate to be processed by the method of the invention.

FIG. 1 is a perspective view of a semiconductor device wafer 2 as a substrate to be processed by the processing method of the present invention. The semiconductor device wafer 2 is a single crystal substrate.

In other embodiments, the substrate to be processed by the processing method of the present invention may be a glass substrate or a compound substrate, such as a compound semiconductor substrate, e.g., a GaAs substrate, or a polycrystalline substrate, such as a ceramic substrate.

The semiconductor device wafer 2 shown in FIG. 1 is substantially composed of a silicon (Si) substrate with a thickness of, for example, 400 µm. A plurality of semiconductor devices 21, such as ICs and LSIs, is formed in a device area 20 on a front side 2a, i.e., a first surface, of the silicon substrate. The semiconductor devices 21 are provided on the front side 2a of the silicon substrate in a grid or matrix arrangement. The semiconductor devices 21 are separated by a plurality of crossing division lines 22 formed on the front side 2a of the silicon substrate, i.e., on the front side 2a of the semiconductor device wafer 2.

Further, the semiconductor device wafer 2 has a back side 2b, i.e., a second surface, which is opposite the front side 2a.

Figure 5:
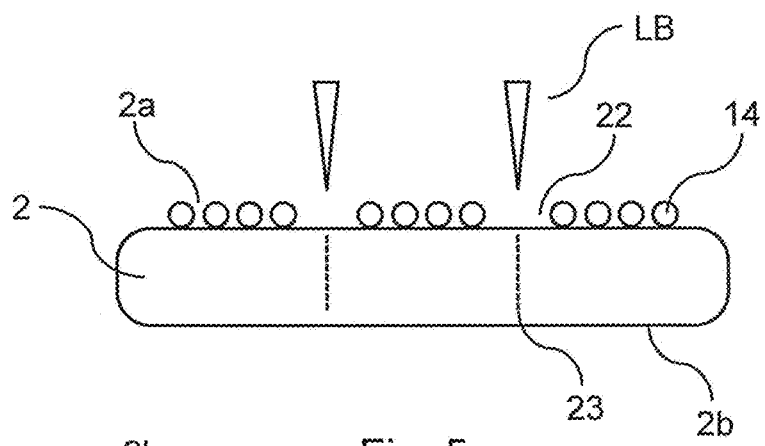
FIG. 5 is a cross-sectional view illustrating a step of applying a pulsed laser beam to the front side of the semiconductor device wafer of FIG. 1 according to a first embodiment of the method of the present invention.

The device area 20 is formed with a plurality of protrusions 14 protruding from a plane surface of the semiconductor device wafer 2, as is schematically shown, for example, in FIG. 5. The protrusions 14 may be, for example, bumps for establishing an electrical contact with the semiconductor devices 21 of the device area 20 in the separated chips or dies. The height of the protrusions 14 in the thickness direction of the semiconductor device wafer 2 may be, for example, in the range of 20 to 200 µm.

In the following, a first embodiment of the method of the present invention for processing the semiconductor device wafer 2 as the substrate will be described with reference to FIGS. 2 to 14.

Figure 2:
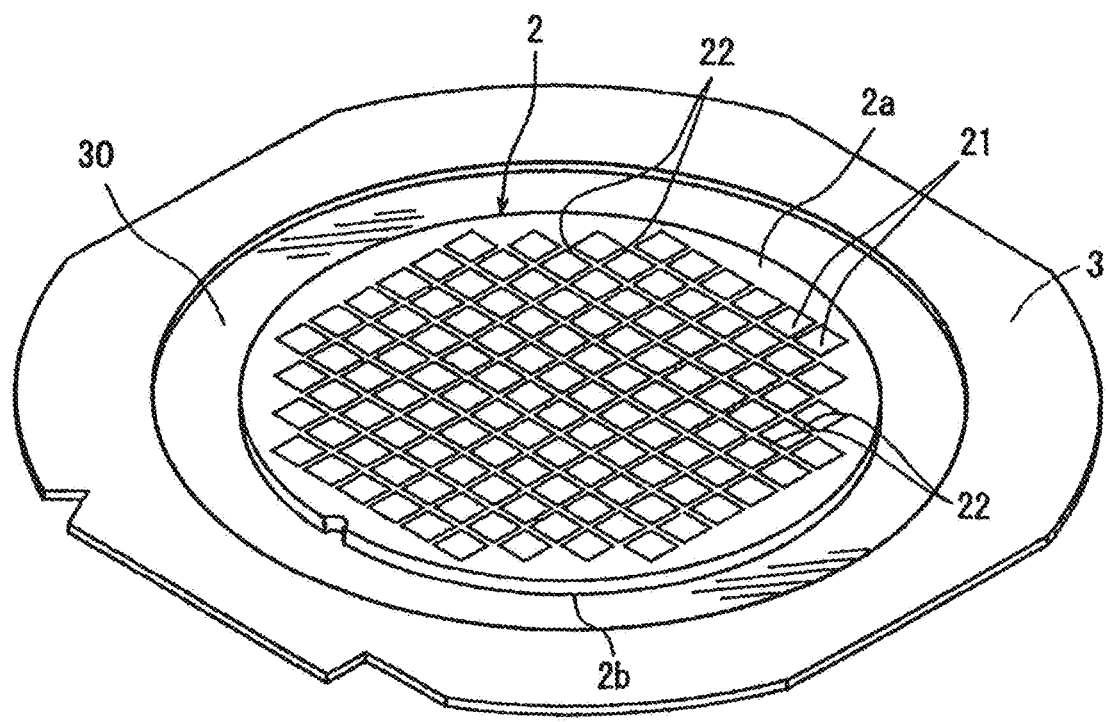
FIG. 2 is a perspective view showing a condition in which the semiconductor device wafer of FIG. 1 is attached to an adhesive tape supported by an annular frame.

First, a wafer supporting step is performed in such a manner that the semiconductor device wafer 2 is attached to an adhesive tape supported by an annular frame. Specifically, as is shown in FIG. 2, an adhesive tape 30 is supported at a peripheral portion thereof by an annular frame 3, so as to close an inner opening of the annular frame 3 by the adhesive tape 30. The back side 2b, i.e., the second surface, of the semiconductor device wafer 2 is attached to the adhesive tape 30. Accordingly, the front side 2a of the semiconductor device wafer 2 attached to the adhesive tape 30 is oriented upwards, as is shown in FIG. 2.

The wafer supporting step detailed above is an optional step. Alternatively, the wafer 2 may be handled without an adhesive tape, such as the adhesive tape 30, and without a frame, such as the annular frame 3. For example, the wafer 2 may be placed in position by using a non-contact pad or a Bernoulli handling pad without touching the device area 20. In this way, the method can be further simplified. The steps illustrated in FIGS. 3 to 5 and explained in detail below may be carried out without support by an adhesive tape and a frame.

Figure 3:
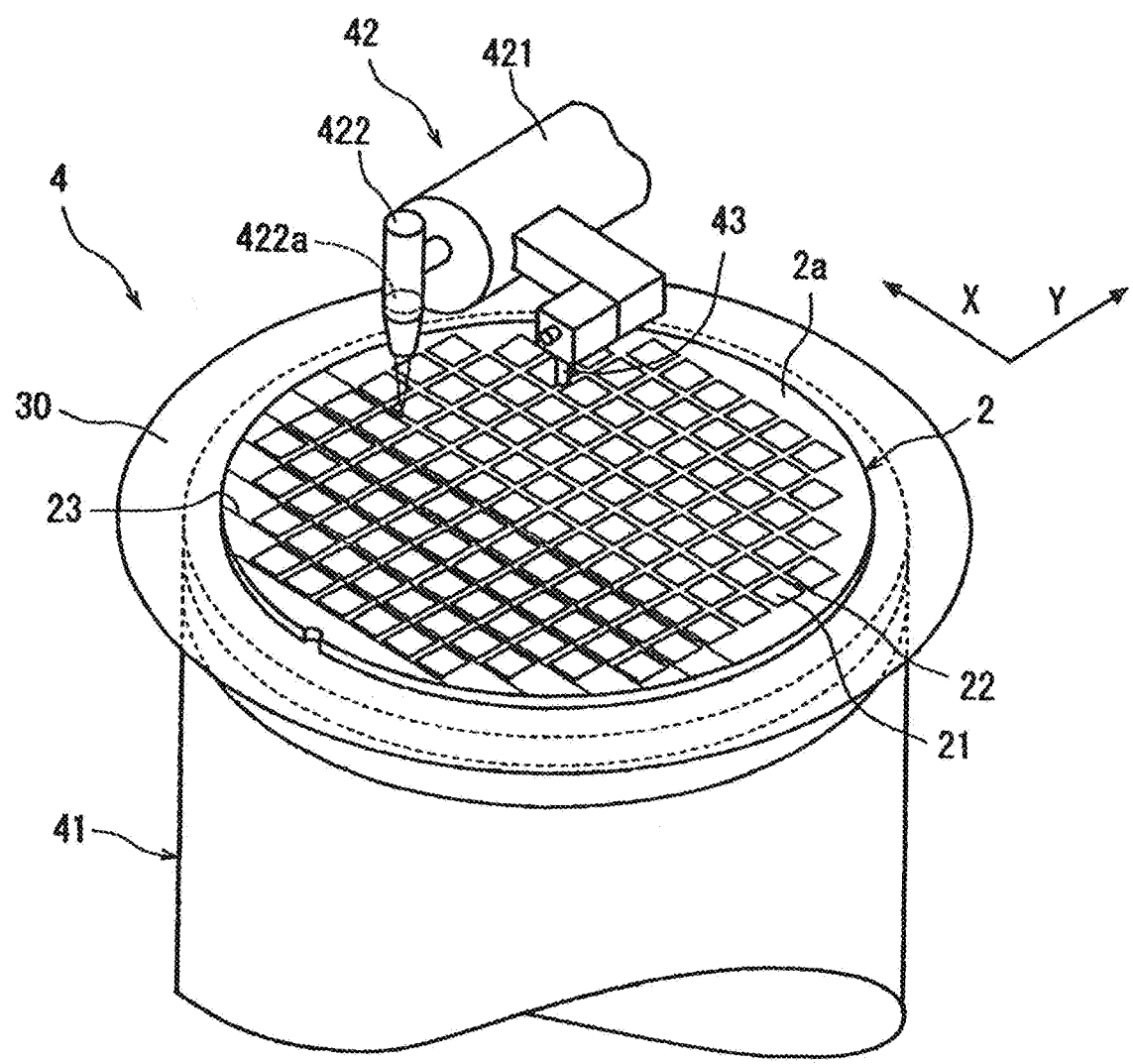
FIG. 3 is a perspective view of a part of a laser processing apparatus for applying a pulsed laser beam to the semiconductor device wafer of FIG. 1.

FIG. 3 shows a part of a laser processing apparatus 4 for performing laser processing along the division lines 22 on the semiconductor device wafer 2 after carrying out the wafer supporting step described above. As is shown in FIG. 3, the laser processing apparatus 4 includes a chuck table 41 for holding a workpiece, in particular, the semiconductor device wafer 2, a laser beam applying means 42 for applying a laser beam to the workpiece held on the chuck table 41, and an imaging means 43 for imaging the workpiece held on the chuck table 41. The chuck table 41 has an upper surface as a holding surface for holding the workpiece thereon under suction. The chuck table 41 is movable by a feeding means (not shown) in a feeding direction which is indicated in FIG. 3 by an arrow X. Further, the chuck table 41 is movable by an indexing means (not shown) in an indexing direction which is indicated in FIG. 3 by an arrow Y.

The laser beam applying means 42 includes a cylindrical casing 421 extending in a substantially horizontal direction. The casing 421 contains a pulsed laser beam oscillating means (not shown) including a pulsed laser oscillator and a repetition frequency setting means. Further, the laser beam applying means 42 includes a focusing means 422 mounted on a front end of the casing 421. The focusing means 422 comprises a focusing lens 422a for focusing a pulsed laser beam oscillated by the pulsed laser beam oscillating means.

The numerical aperture (NA) of the focusing lens 422a of the focusing means 422 may be set so that the value obtained by dividing the numerical aperture of the focusing lens 422a by the refractive index (n) of the single crystal substrate is within the range of 0.2 to 0.85.

The laser beam applying means 42 further includes a focal position adjusting means (not shown) for adjusting the focal position of the pulsed laser beam to be focused by the focusing lens 422a of the focusing means 422.

The imaging means 43 is mounted on a front end portion of the casing 421 of the laser beam applying means 42. The imaging means 43 includes an ordinary imaging device (not shown), such as a CCD, for imaging the workpiece by using visible light, an infrared light applying means (not shown) for applying infrared light to the workpiece, an optical system (not shown) for capturing the infrared light applied to the workpiece by the infrared light applying means, and an infrared imaging device (not shown), such as an infrared CCD, for outputting an electrical signal corresponding to the infrared light captured by the optical system. An image signal output from the imaging means 43 is transmitted to a control means (not shown).

When performing laser processing along the division lines 22 of the semiconductor device wafer 2 by using the laser processing apparatus 4, a positioning step is performed in such a manner that the focusing lens 422a of the focusing means 422 and the single crystal substrate, i.e., the semiconductor device wafer 2, are positioned relative to each other in the direction along the optical axis of the focusing lens 422a so that the focal point of the pulsed laser beam is located at a desired position in the direction along the thickness of the semiconductor device wafer 2, i.e., at a desired distance from the front side 2a, i.e., the first surface, in the direction from the front side 2a towards the back side 2b, i.e., the second surface.

When performing the processing method according to the current embodiment of the present invention, the semiconductor device wafer 2 attached to the adhesive tape 30 is first placed on the chuck table 41 of the laser processing apparatus 4 shown in FIG. 3 in the condition where the adhesive tape 30 is in contact with the upper surface of the chuck table 41 (see FIG. 3). Subsequently, a suction means (not shown) is operated to hold the semiconductor device wafer 2 through the adhesive tape 30 on the chuck table 41 under suction (wafer holding step). Accordingly, the front side 2a of the semiconductor device wafer 2 held on the chuck table 41 is oriented upward. Although, for the purpose of better presentability, the annular frame 3 supporting the adhesive tape 30 is not shown in FIG. 3, the annular frame 3 is held by a frame holding means, such as clamps or the like, provided on the chuck table 41 in this embodiment. Subsequently, the chuck table 41 holding the semiconductor device wafer 2 under suction is moved to a position directly below the imaging means 43 by operating the feeding means.

In the condition where the chuck table 41 is positioned directly below the imaging means 43, an alignment operation is performed by the imaging means 43 and the control means (not shown) in order to detect a subject area of the semiconductor device wafer 2 to be laser processed. Specifically, the imaging means 43 and the control means perform image processing, such as pattern matching, in order to align the division lines 22 extending in a first direction on the semiconductor device wafer 2 with the focusing means 422 of the laser beam applying means 42. In this way, alignment of a laser beam applying position is performed (alignment step). This alignment step is performed in a similar manner also for all the other division lines 22 extending in a second direction perpendicular to the first direction on the semiconductor device wafer 2.

Figure 4:
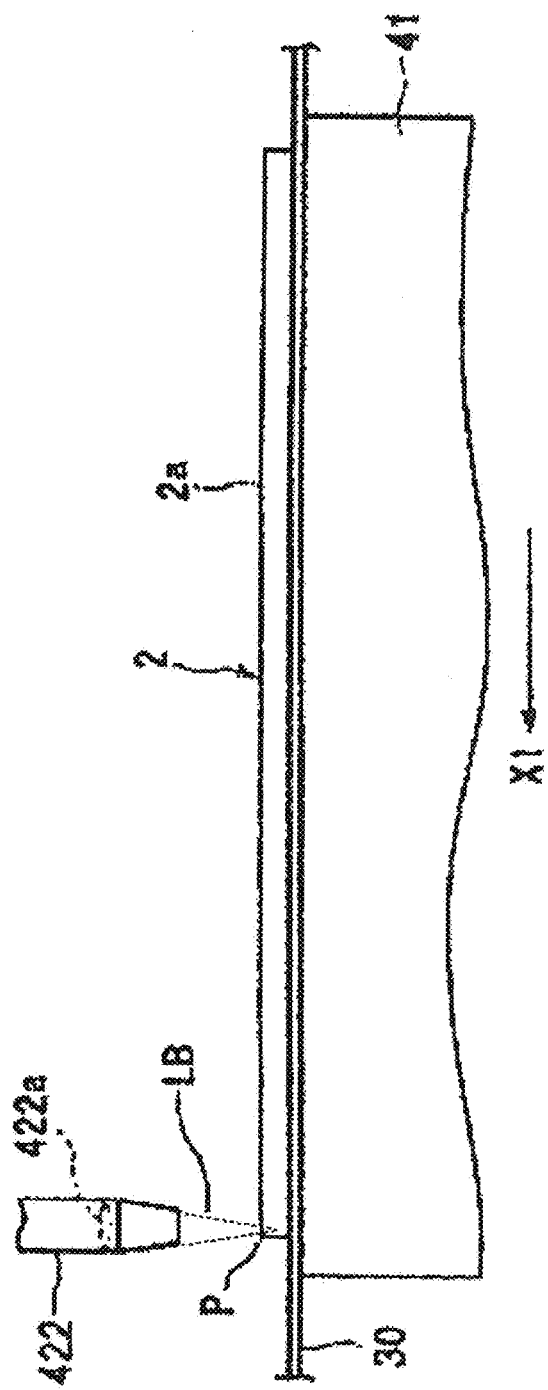
FIG. 4 is a side view for illustrating a step of forming a plurality of modified regions inside the semiconductor device wafer of FIG. 1.

After performing the alignment step detailed above for all of the division lines 22 on the front side 2a of the semiconductor device wafer 2, the chuck table 41 is moved to a laser beam applying area where the focusing means 422 of the laser beam applying means 42 is located, as is shown in FIG. 4. One end (the left end in FIG. 4) of a predetermined division line 22 extending in the first direction is positioned directly below the focusing means 422. Further, the focal position adjusting means (not shown) is operated so as to move the focusing means 422 in the direction along the optical axis of the focusing lens 422a so that the focal point P of a pulsed laser beam LB to be focused by the focusing lens 422 is located at a desired distance from the front side 2a of the semiconductor device wafer 2 in the direction from the front side 2a towards the back side 2b thereof, i.e., in the thickness direction of the semiconductor device wafer 2 (positioning step).

In this preferred embodiment, the focal point P of the pulsed laser beam LB is located inside the semiconductor device wafer 2 at a position near the front side 2a, i.e., the upper surface, of the semiconductor device wafer 2 to which the pulsed laser beam LB is applied. For example, the focal point P may be located at a distance from the front side 2a in the range of 5 µm to 10 µm.

After performing the positioning step described above, a modified region forming step is performed in such a manner that the laser beam applying means 42 is operated to apply the pulsed laser LB from the focusing means 422 to the semiconductor device wafer 2, thereby forming modified regions inside the semiconductor device wafer 2, the modified regions being arranged within the bulk of the wafer 2 (see also FIG. 14(d)).

Specifically, the pulsed laser beam LB, which has a wavelength that allows transmission of the laser beam LB through the silicon substrate constituting the semiconductor device wafer 2, is applied to the semiconductor device wafer 2 by the focusing means 422, and the chuck table 41 is moved at a predetermined feed speed in the direction indicated by an arrow X1 in FIG. 4 (modified region forming step). When the other end (right end in FIG. 4) of the predetermined division line 22 reaches the position directly below the focusing means 422, the application of the pulsed laser beam LB is stopped and the movement of the chuck table 41 is also stopped.

By performing the modified region forming step detailed above along the predetermined division line 22, a plurality of modified regions 23 (see FIG. 14(d)) is formed in the semiconductor device wafer 2 along the division line 22, wherein each modified region 23 is arranged within the bulk of the wafer 2. Each modified region 23 is composed of a space 231, e.g., a cavity, inside the wafer material and an amorphous region 232 surrounding the space 231, as is schematically shown in FIG. 14(d) and will be further detailed below.

The modified regions 23 may be formed along the division line 22 at predetermined, equidistant intervals in the extension direction of the division line 22. For example, the distance between adjacent modified regions 23 in the extension direction of the division line 22 may be in the range of 8 µm to 30 µm, e.g., approximately 16 µm (=(work feed speed: 800 mm/second)/(repetition frequency: 50 kHz)).

Figure 22:
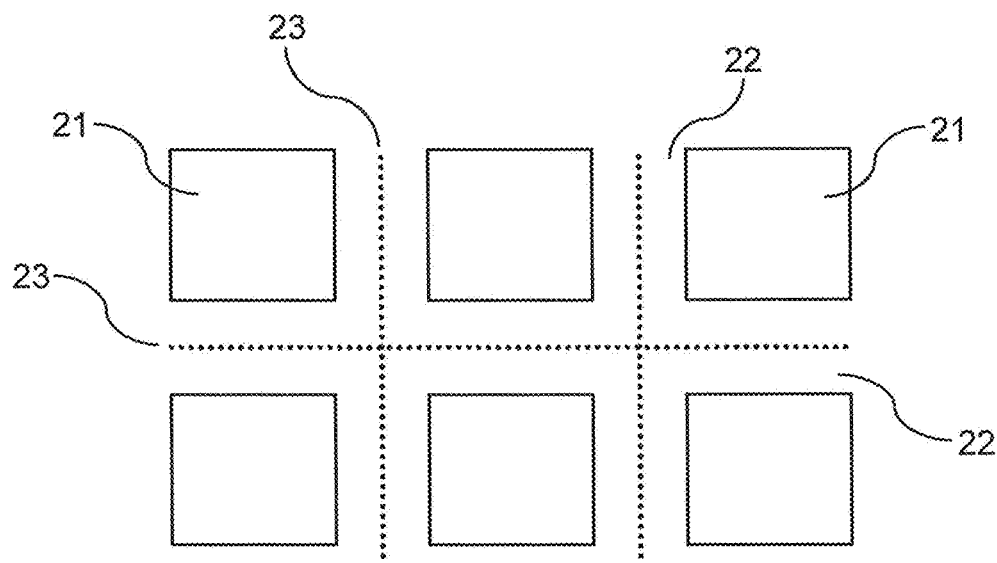
FIG. 22 is a schematic top view illustrating the arrangement of the modified regions in the semiconductor device wafer of FIG. 1 according to an embodiment of the method of the present invention.

In this embodiment, the amorphous regions 232 of adjacent modified regions 23 are formed so as not to overlap each other (see FIG. 22). Specifically, the distance between adjacent modified regions 23 is chosen so as to be slightly larger than the outer diameter of the amorphous regions 232.

In other embodiments, the substrate may be, for example, a glass substrate and the modified regions may comprise or be regions in which cracks are formed in the glass substrate. The cracks formed in the glass substrate may be microcracks.

It is sufficient to apply the pulsed laser beam LB once for the formation of each modified region 23, so that the productivity can be greatly enhanced. Furthermore, no debris is scattered in the modified region forming step, so that a degradation of the quality of the resulting devices can be reliably prevented.

A single row of modified regions 23 may be formed within the width of each of the division lines 22, as is schematically shown in FIG. 22. In this case, the method of the invention can be performed in a particularly quick and efficient manner.

Figure 23:
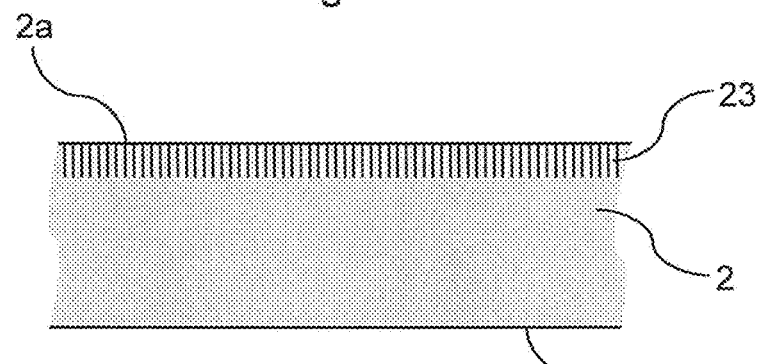
FIG. 23 is a cross-sectional view illustrating the arrangement of the modified regions in the semiconductor device wafer of FIG. 1 according to an embodiment of the method of the present invention.

In each of the plurality of positions along each of the division lines 22 where the pulsed laser beam LB is applied, a single modified region 23 may be formed, so as to obtain a single layer of modified regions 23 in the thickness direction of the semiconductor device wafer 2, as is schematically shown in FIG. 23.

Alternatively, in each of the plurality of positions along each of the division lines 22 where the pulsed laser beam LB is applied, plural modified regions 23 may be formed, the plural modified regions 23 being arranged next to one another along the thickness direction of the semiconductor device wafer 2.

Figure 24:
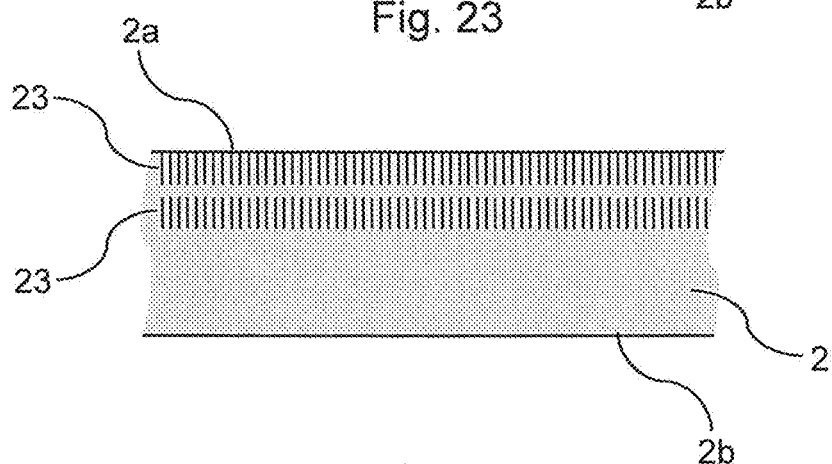
FIG. 24 is a cross-sectional view illustrating the arrangement of the modified regions in the semiconductor device wafer of FIG. 1 according to an embodiment of the method of the present invention.

By arranging plural modified regions 23 next to one another in this manner, plural layers of modified regions 23 can be formed, wherein the plural layers are stacked along the thickness direction of the semiconductor device wafer 2. For example, the number of layers of modified regions 23 may be two, as is schematically shown in FIG. 24.

The formation of a modified region 23 inside the semiconductor device wafer 2 is illustrated in FIGS. 14(a) to 14(e). The substrate of the wafer 2 is made of a material which is transparent to the pulsed laser beam LB, namely silicon. Thus, the modified region 23 is formed in the wafer 2 by the application of the pulsed laser beam LB having a wavelength that allows transmission of the laser beam LB through the wafer 2. For example, the pulsed laser beam LB may have a wavelength in the infrared range, e.g., 1064 nm.

Figure 14:
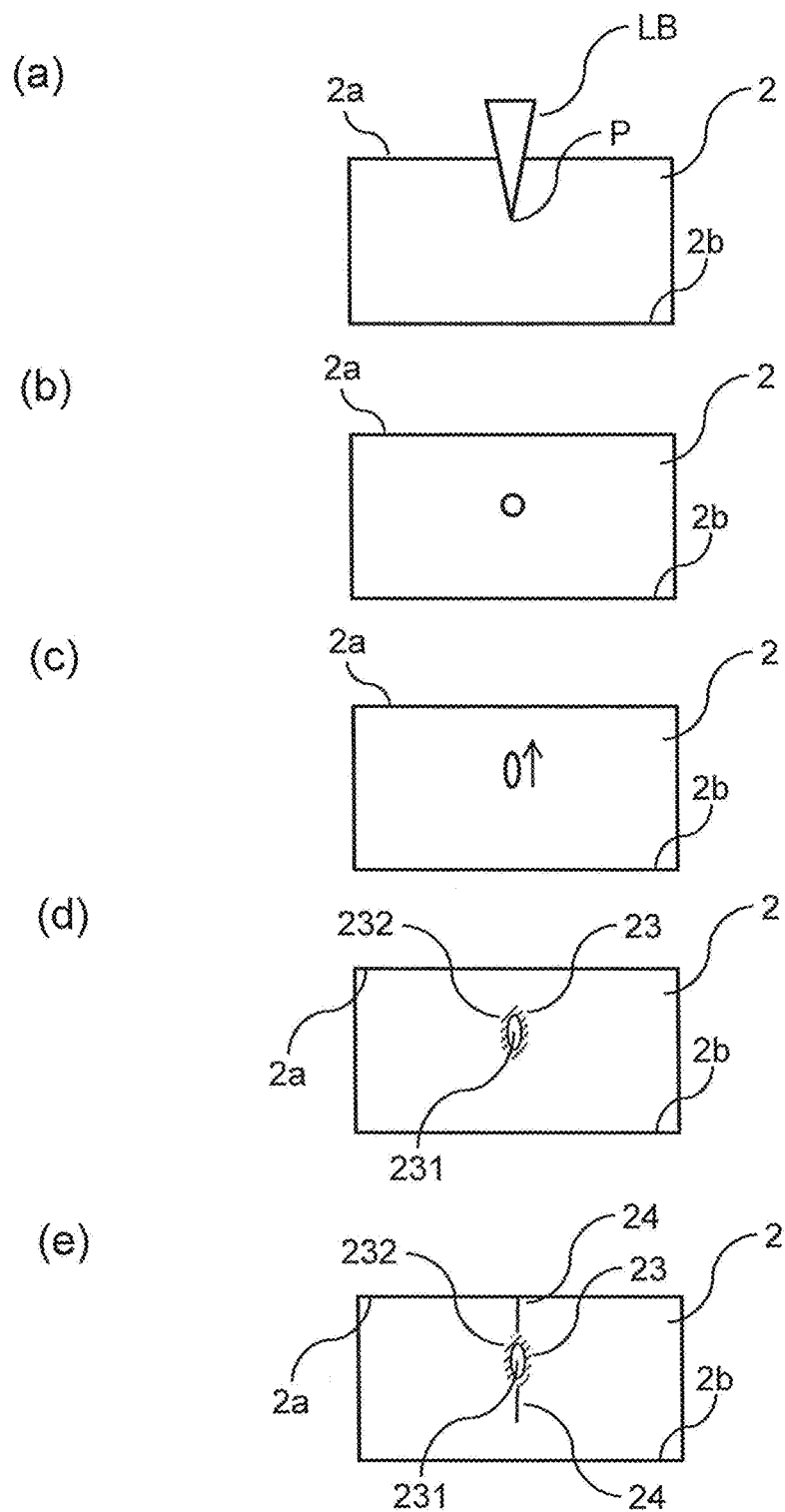
FIGS. 14 (a) to 14(e) are cross-sectional views illustrating the formation of a modified region inside the semiconductor device wafer of FIG. 1.
Figure 15:
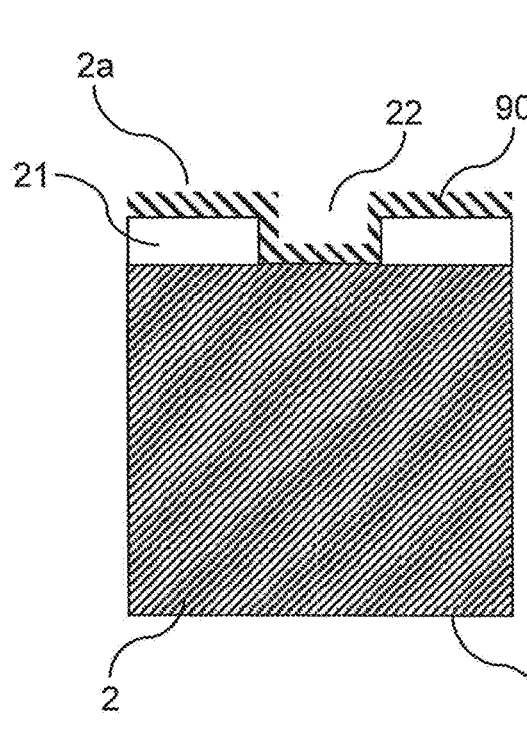
FIG. 15 is a cross-sectional view showing the outcome of a step of applying a plasma resistant coating to the front side of the semiconductor device wafer of FIG. 1 according to a second embodiment of the method of the present invention.

The pulsed laser beam LB is applied to the wafer 2 from the side of the first surface 2a in a condition where the focal point P of the pulsed laser beam LB is located at a distance from the first surface 2a in the direction from the first surface 2a towards the second surface 2b (see FIG. 14(a)). Due to the application of the pulsed laser beam LB, the wafer material is locally heated up in the region inside the wafer 2 where the focal point P is arranged. The heated up region of the wafer 2 at the initial stage of the laser beam application is schematically indicated by a circle in FIG. 14 (b).

As the application of the pulsed laser beam LB continues, the heated up region grows or expands in the direction towards the first surface 2a, as is indicated by an arrow in FIG. 14(c). When the laser beam application is stopped, the heated up wafer material cools down, resulting in the formation of the modified region 23 which is composed of the space 231 inside the wafer 2 and the amorphous region 232 fully surrounding the space 231 (see FIG. 14(d)). As is shown in FIG. 14(d), the modified region 23 is arranged within the bulk of the wafer 2.

The formation of the modified region 23 in the semiconductor device wafer 2 induces stress or strain in the wafer 2 in the vicinity of the modified region 23, resulting in the formation of cracks 24 extending from the modified region 23, as is schematically shown in FIG. 14(e). In particular, these cracks 24 may propagate towards the front side 2a and the back side 2b of the semiconductor device wafer 2 (see FIG. 14(e)). The cracks 24 do not form part of the modified region 23 but rather originate from the modified region 23. Specifically, the cracks 24 are not directly created by a structural modification of the substrate material induced by the application of the pulsed laser beam LB.

In the embodiment shown in FIG. 14(e), one of the cracks 24 formed in this manner reaches the front side 2a of the semiconductor device wafer 2, thus providing an opening in the front side 2a. Hence, a crack 24 originating from the modified region 23 extends in the thickness direction of the semiconductor device wafer 2 to the side of the wafer 2 from which the pulsed laser beam LB is applied.

Further, cracks (not shown) originating from the modified regions 23 may at least substantially extend along the extension directions of the division lines 22. The modified regions 23 may be provided along each of the division lines 22 so that they are arranged at a distance from each other in the extension direction of the respective division line 22 (see, for example, FIG. 22) but connected with each other through the cracks extending therefrom.

If, in each of the plurality of positions along each of the division lines 22 where the pulsed laser beam LB is applied, plural modified regions 23 are formed, the plural modified regions 23 being arranged next to one another along the thickness direction of the semiconductor device wafer 2, the modified regions 23 may be provided so that they are arranged at a distance from each other in the thickness direction of the wafer 2 (see, for example, FIG. 24) but connected with each other through the cracks 24 extending therefrom.

Crack formation and propagation may be controlled, for example, by suitably controlling the arrangement of the focal point P of the laser beam LB, the wavelength of the laser beam LB, the power of the laser beam LB and/or the pulse length of the laser beam LB.

The formation of the modified regions 23 in the semiconductor device wafer 2 along the division lines 22 by the application of the pulsed laser beam LB is also schematically shown in FIG. 5.

As an optional step, after forming the modified regions 23 in the semiconductor device wafer 2, a plasma resistant coating may be applied to the front side 2a of the wafer 2 for protecting the devices 21 in a later step of applying a plasma to the front side 2a which will be detailed further below (see FIG. 12). For example, the plasma resistant coating may be a water soluble coating or a different type of coating.

Figure 6:
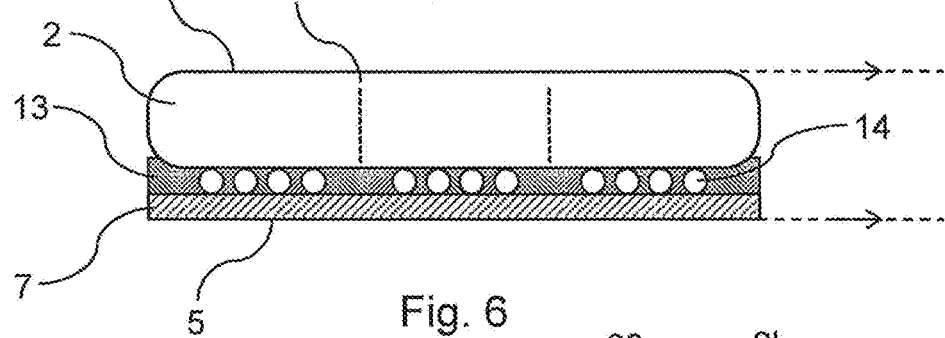
FIG. 6 is a cross-sectional view showing the outcome of a step of applying a protective sheeting to the front side of the semiconductor device wafer according to the first embodiment of the method of the present invention.

After forming the modified regions 23 in the semiconductor device wafer 2 or after the optional step of applying the plasma resistant coating to the front side 2a, a protective sheeting 5 is attached to the front side 2a of the wafer 2 (see FIG. 6). The protective sheeting 5 comprises a base sheet 7, a cushioning layer 13 applied to a front surface of the base sheet 7, a protective film (not shown), a back surface of which is attached to the cushioning layer 13, and an adhesive layer (not shown) applied to a part of a front surface of the protective film 4 opposite to the back surface thereof. The adhesive layer may have an annular shape and be provided in a circumferential or peripheral portion of the front surface of the protective film. Alternatively, the adhesive layer may be provided over an entire contact area of the front side 2a of the semiconductor device wafer 2 and the protective film. In particular, the adhesive may be provided over an entire surface of the protective film which is in contact with the front side 2a of the wafer 2.

The cushioning layer 13 may be curable by an external stimulus, such as UV radiation, heat, an electric field and/or a chemical agent. In particular, the cushioning layer 13 may be formed of a curable resin, such as ResiFlat by DISCO Corporation or TEMPLOC by DENKA.

The protective sheeting 5 is attached to the semiconductor device wafer 2 by attaching the front surface of the protective film to the front side 2a of the wafer 2 and adhering the protective film to the wafer 2 by the adhesive layer. Further, the protrusions 14 protruding from the plane surface of the wafer 2 are embedded in the cushioning layer 13, as is schematically shown in FIG. 6.

The protective film covers the devices 21 formed in the device area 20, including the protrusions 14, thus protecting the devices 21 against damage or contamination. Moreover, by embedding the protrusions 14 in the cushioning layer 13, the protrusions 14 are reliably protected from any damage during wafer processing, in particular, in a subsequent grinding step.

The protective sheeting 5 is attached to the semiconductor device wafer 2 so that the back surface of the base sheet 7 is substantially parallel to the back side 2b of the wafer 2, as is indicated by dashed arrows in FIG. 6. Specifically, the semiconductor device wafer 2 and the protective sheeting 5 may be pressed together by applying a parallel pressing force to the wafer back side 2b and the back surface of the base sheet 7, for example, in a mounting chamber (not shown), so as to reliably embed the protrusions 14 in the cushioning layer 13 and achieve the substantially parallel alignment of base sheet back surface and wafer back side 2b.

Since the plane back surface of the base sheet 7 is substantially parallel to the back side 2b of the semiconductor device wafer 2, the pressure applied to the wafer 2 during the grinding process, e.g., by a grinding wheel of a grinding apparatus (see FIG. 13), is evenly and homogenously distributed over the wafer 2, thus minimising any risk of a pattern transfer, i.e., a transfer of the pattern defined by the protrusions 14 in the device area 20 to the ground wafer back side 2b, and breakage of the wafer 2. Further, the substantially parallel alignment of the flat, even back surface of the base sheet 7 and the back side 2b of the semiconductor device wafer 2 allows for the grinding step to be carried out with a high degree of precision, thus achieving a particularly uniform and homogenous wafer thickness after grinding.

Figure 7:
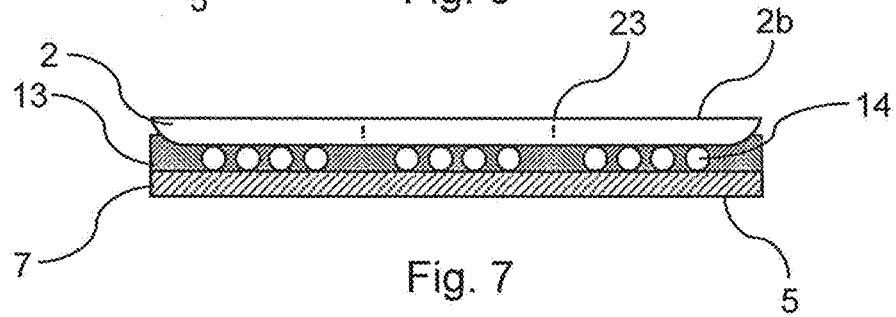
FIG. 7 is a cross-sectional view showing the outcome of a step of grinding the back side of the semiconductor device wafer according to the first embodiment of the method of the present invention.

After attaching the protective sheeting 5 to the semiconductor device wafer 2, the back side 2b of the wafer 2 is ground to adjust the wafer thickness. The outcome of this grinding step is shown in FIG. 7. The step of grinding the back side 2b of the semiconductor device wafer 2 may be carried out using a grinding apparatus, as will be described in detail in the following with reference to FIG. 13.

Figure 13:
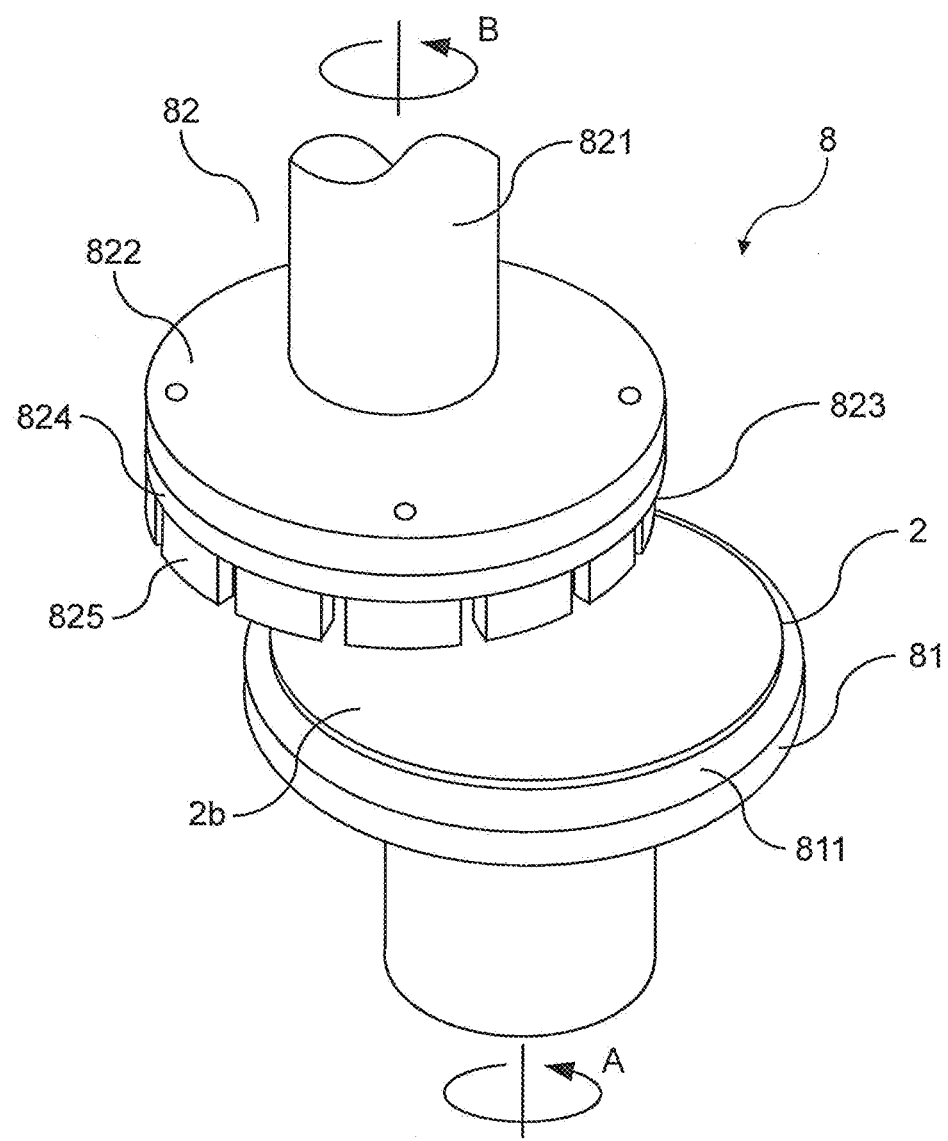
FIG. 13 is a perspective view showing a grinding apparatus for performing a grinding step.

FIG. 13 is a perspective view showing a grinding apparatus 8 for performing a grinding step according to an embodiment of the present invention. As is shown in FIG. 13, the grinding apparatus 8 includes a chuck table 81 for holding a workpiece, such as the semiconductor device wafer 2, and a grinding means 82 for grinding the workpiece held on the chuck table 81. The chuck table 81 has an upper surface 811 as a holding surface for holding the workpiece thereon under suction. The grinding means 82 includes a spindle housing (not shown), a rotating spindle 821 rotatably supported to the spindle housing and adapted to be rotated by a driving mechanism (not shown), a mounter 822 fixed to the lower end of the rotating spindle 821 and a grinding wheel 823 mounted on the lower surface of the mounter 822. The grinding wheel 823 comprises a circular base 824 and abrasive elements 825 mounted on the lower surface of the circular base 824.

Grinding of the back side 2b of the semiconductor device wafer 2 is performed by holding the wafer 2 on the chuck table 81 of the grinding apparatus 8 so that the back surface of the base sheet 7 is in contact with the upper surface 811 of the chuck table 81. Hence, the back side 2b of the wafer 2 is oriented upwards, as is shown in FIG. 13. Subsequently, the chuck table 81 with the semiconductor device wafer 2 held thereon is rotated around an axis perpendicular to the plane of the semiconductor device wafer 2, i.e., in the rotational direction indicated by an arrow A in FIG. 13, and the grinding wheel 823 is rotated around an axis perpendicular to the plane of the circular base 824, i.e., in the rotational direction indicated by an arrow B in FIG. 13.

While rotating the chuck table 81 and the grinding wheel 823 in this manner, the abrasive elements 825 of the grinding wheel 823 are brought into contact with the back side 2b of the wafer 2, thus grinding the back side 2b.

After grinding the back side 2b of the semiconductor device wafer 2, the ground back side 2b may be polished and/or etched, e.g., by dry etching and/or wet etching.

By polishing, such as dry polishing or chemical mechanical polishing (CMP), and/or etching, such as plasma etching etc., the ground back side 2b, stress induced in the semiconductor device wafer 2 can be removed, thereby further enhancing the die strength of the chips or dies obtained after dividing the wafer 2.

However, the polishing and/or etching step may also be omitted, in particular, if the semiconductor device wafer 2 is subsequently subjected to a plasma process, such as plasma dicing, as will be detailed further below.

Figure 8:
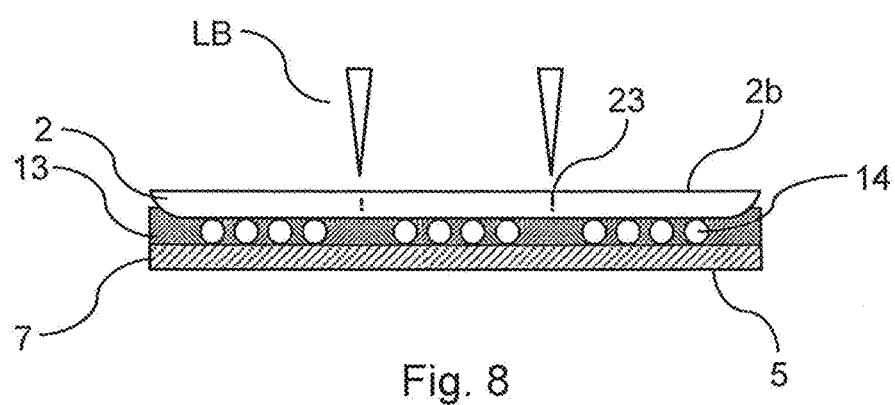
FIG. 8 is a cross-sectional view illustrating a step of applying a pulsed laser beam to the ground back side of the semiconductor device wafer according to the first embodiment of the method of the present invention.

After grinding or grinding and polishing/etching the back side 2b of the semiconductor device wafer 2, as a further optional step, a pulsed laser beam LB may be applied to the wafer 2 from the side of the ground back side 2b of the wafer 2, as is schematically shown in FIG. 8. The pulsed laser beam LB may be applied to the wafer 2 substantially in the same manner as detailed above. Preferably, the pulsed laser beam LB applied from the side of the ground back side 2b of the wafer 2 has a lower power than the pulsed laser beam LB applied from the side of the front side 2a of the wafer 2.

The pulsed laser beam LB is applied to the semiconductor device wafer 2 at least in a plurality of positions along each of the division lines 22, in a condition where a focal point (not shown) of the pulsed laser beam LB is located at a distance from the ground back side 2b in the direction from the ground back side 2b towards the front side 2a, so as to form a plurality of further modified regions (not shown) in the semiconductor device wafer 2 along each of the division lines 22.

Figure 9:
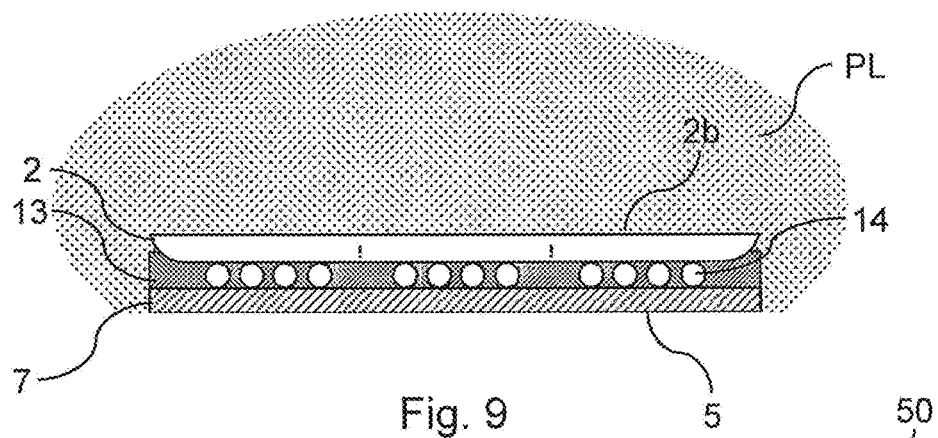
FIG. 9 is a cross-sectional view illustrating a step of applying a plasma to the ground back side of the semiconductor device wafer according to the first embodiment of the method of the present invention.

Subsequently, a plasma PL is applied to the ground back side 2b of the semiconductor device wafer 2, as is schematically shown in FIG. 9. Specifically, the plasma PL is applied to the wafer 2 by exposing the ground back side 2b to a plasma atmosphere (indicated by a dotted area in FIG. 9), e.g., in a plasma chamber. The plasma PL is applied directly to the ground back side 2b, i.e., without employing a mask.

In some embodiments, the plasma PL may be applied to the ground back side 2b of the wafer 2 in order to remove, by plasma etching, stress induced in the wafer 2.

In the current embodiment, the plasma PL is applied to the ground back side 2b so that the wafer 2 is divided along the division lines 22 by plasma dicing. Thus, the wafer 2 is fully divided into individual chips or dies in the plasma applying step.

The side walls of the resulting dies or chips are plasma etched in the plasma applying step. Hence, no mechanical dicing stress is imparted to the dies or chips in the division process. Therefore, the die strength of the dies or chips is further enhanced.

Due to the formation of the modified regions 23 in the semiconductor device wafer 2, the plasma PL can remove the wafer material along the division lines 22 in a particularly quick and efficient manner, thereby further facilitating the wafer division process. In particular, in the modified regions 23, the wafer material can be removed more quickly by the plasma PL as compared to non-modified regions. Further, the modified regions 23 can allow the plasma PL to enter into the wafer 2, in particular, through cracks 24 extending all the way to the wafer surface (see, for example, FIG. 14(*e*)), thus further accelerating the plasma division process.

Figure 10:
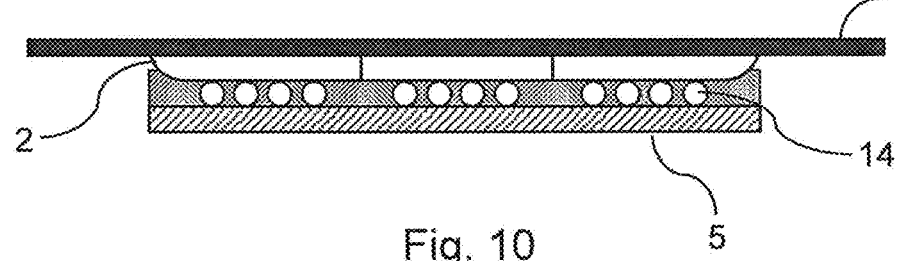
FIG. 10 is a cross-sectional view showing the outcome of a step of attaching the semiconductor device wafer to an adhesive tape according to the first embodiment of the method of the present invention.

After dividing the semiconductor device wafer 2 along the division lines 22 in this manner, an adhesive tape 50 is attached to the ground back side 2b of the wafer 2. The result of this attachment step is illustrated in FIG. 10. At this stage of processing, the chips or dies are held in close proximity to each other by the protective sheeting 5 (see FIG. 10).

Figure 11:
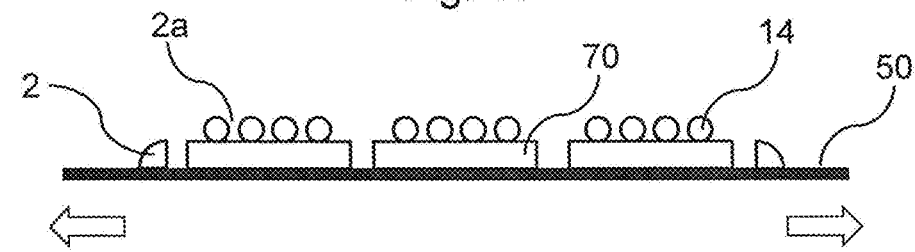
FIG. 11 is a cross-sectional view showing the outcome of steps of removing the protective sheeting and radially expanding the adhesive tape according to the first embodiment of the method of the present invention.

Subsequently, the protective sheeting 5 is removed from the wafer front side 2a and the adhesive tape 50 is radially expanded (as is indicated by arrows in FIG. 11), e.g., by using an expansion drum or the like. The outcome of these steps is shown in FIG. 11. By radially expanding the adhesive tape 50, the chips or dies 70 (see FIG. 11) are spaced apart from each other, enabling safe handling of the chips or dies 70 during further processing, storage or shipping.

Figure 12:
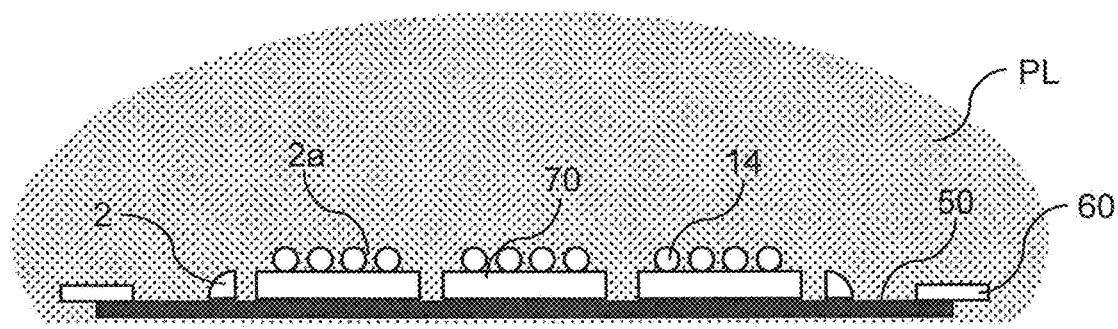
FIG. 12 is a cross-sectional view illustrating a step of applying a plasma to the front side of the divided semiconductor device wafer according to the first embodiment of the method of the present invention.

As a further optional step, after radially expanding the adhesive tape 50, the separated chips or dies 70 may be subjected to an additional plasma treatment, as is shown in FIG. 12. Prior to performing this plasma treatment, the adhesive tape 50 may be attached to an annular frame 60 so that the divided wafer 2 is arranged within a central opening of the annular frame 60 (see FIG. 12). The plasma PL may be applied to the front side 2a of the divided semiconductor device wafer 2, i.e., to the front sides and side walls of the chips or dies 70, substantially in the same manner as detailed above with reference to FIG. 9.

In this way, stress induced in the chips or dies 70 can be removed, thereby further enhancing their die strength. By applying the plasma resistant coating to the front side 2a of the wafer 2, as has been detailed above, it can be reliably ensured that the devices 21 of the chips or dies 70 are protected from being damaged by the plasma PL.

Subsequently, after the application of the plasma PL, the plasma resistant coating may be removed from the chips or dies 70.

In the following, a second embodiment of the method of the present invention for processing the semiconductor device wafer 2 as the substrate will be described with reference to FIGS. 15 to 21.

First, a plasma resistant coating 90 is applied to the front side 2a of the wafer 2 for protecting the devices 21 in a later step of applying a plasma to the front side 2a which will be detailed further below (see FIG. 18). For example, the plasma resistant coating 90 may be a water soluble coating or a different type of coating. The plasma resistant coating 90 may be applied to the front side 2a, e.g., by spin coating. The plasma resistant coating 90 is applied to the front side 2a so as to cover the entire front side 2a, i.e., the devices 21 and the division lines 22 (see FIG. 15).

Figure 16:
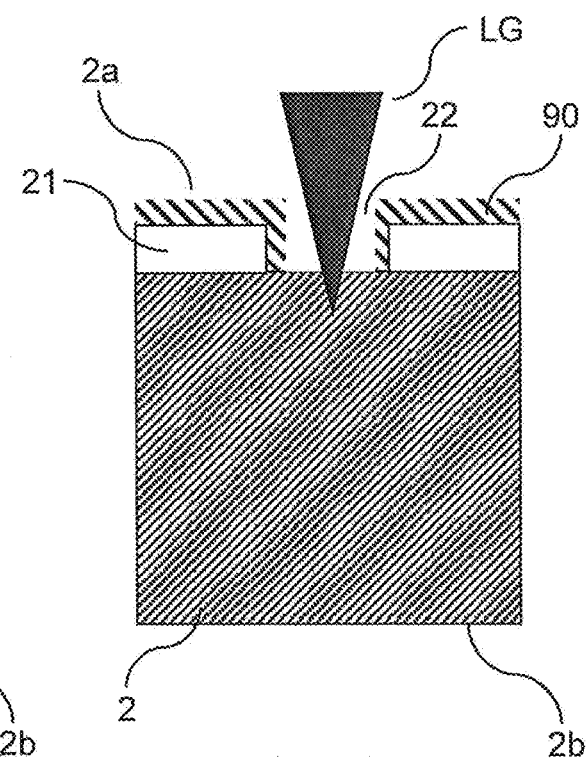
FIG. 16 is a cross-sectional view illustrating a step of laser grooving for partially removing the plasma resistant coating according to the second embodiment of the method of the present invention.
Figure 17:
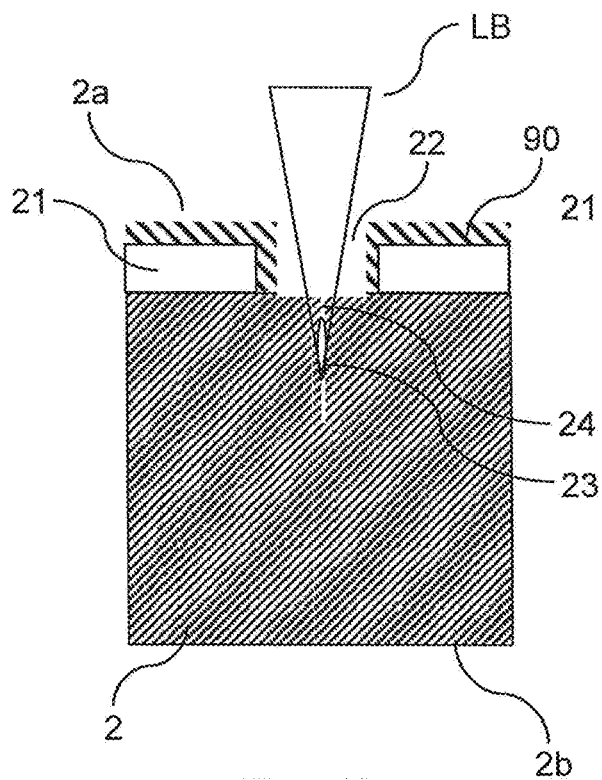
FIG. 17 is a cross-sectional view illustrating a step of applying a pulsed laser beam to the front side of the semiconductor device wafer according to the second embodiment of the method of the present invention.

Subsequently, the plasma resistant coating 90 is removed from the division lines 22 by performing a laser grooving step, as is illustrated in FIG. 16. In this step, a laser beam LG is applied to the wafer 2 along the division lines 22 so as to remove the plasma resistant coating 90. The laser beam LG may also be a pulsed laser beam, in particular, a laser beam with short beam pulses. In this way, an accurately controlled laser grooving process and a particularly smooth grooving surface can be achieved.

If the wafer 2 has on the division lines 22 a metal layer, a layer of material which may affect subsequent application of the pulsed laser beam LB (see FIG. 17), e.g., a layer made of a material which is not transparent to the pulsed laser beam LB, and/or a layer which may affect the process of dividing the wafer 2 along the division lines 22, the respective layer may also be at least partly removed from the division lines 22 in the laser grooving step.

However, the laser grooving step may also be omitted, in particular, if no additional layer as detailed above is present on the division lines 22. In this case, it is preferable to use a plasma resistant coating 90 which is transparent to the pulsed laser beam LB (see FIG. 17).

Subsequently, the pulsed laser beam LB is applied to the semiconductor device wafer 2 from the side of the front side 2a substantially in the same manner as detailed above for the first embodiment. Specifically, the pulsed laser beam LB is applied to the wafer 2 in a plurality of positions along each of the division lines 22, in a condition where a focal point P of the pulsed laser beam LB is located at a distance from the front side 2a in the direction from the front side 2a towards the back side 2b, so as to form a plurality of modified regions 23 in the wafer 2 along each of the division lines 22 (see FIG. 17).

Alternatively, the pulsed laser beam LB may be applied to the semiconductor device wafer 2 from the side of the back side 2b, in particular, if a wafer 2 with a large thickness is processed.

The modified regions 23 of the second embodiment are formed and arranged substantially in the same manner as the modified regions 23 of the first embodiment. In particular, the cracks 24 originating from the modified regions 23 of the second embodiment extend all the way to the front side 2a of the wafer 2 (see FIGS. 17 and 18), thus providing openings in the front side 2a through which the plasma can enter in a subsequent plasma application step.

Figure 18:
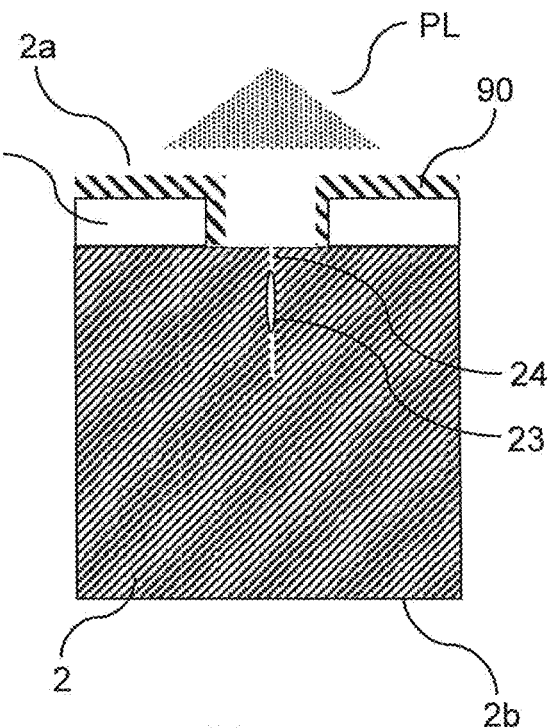
FIG. 18 is a cross-sectional view illustrating a step of applying a plasma to the front side of the semiconductor device wafer according to the second embodiment of the method of the present invention.

After forming the modified regions 23 in the semiconductor device wafer 2, a plasma PL is applied to the wafer 2 from the side of the front side 2a, as is shown in FIG. 18.

The plasma PL is applied to the wafer 2 substantially in the same manner as in the method of the first embodiment, namely by exposing the wafer 2, i.e., the front side 2*a* thereof, to a plasma atmosphere, e.g., in a plasma chamber. In this plasma application step, the devices 21 formed in the device area 20 are reliably protected from the plasma PL by the plasma resistant coating 90.

The cracks 24 extending from the modified regions 23 all the way to the front side 2*a* (see FIGS. 17 and 18), thus providing openings in the front side 2*a*, allow the plasma PL to enter into the wafer 2. Further, in the modified regions 23, the wafer material can be removed more quickly by the plasma PL as compared to non-modified regions. Hence, the process of removing wafer material along the division lines 22 is significantly enhanced by the provision of the modified regions 23 and the associated cracks 24.

As a result of the plasma application step, a plurality of grooves 80 is formed in the semiconductor device wafer 2, the grooves 80 extending along the division lines 22 where the plurality of modified regions 23 has been formed. Stress in the side walls of the grooves 80 is relieved by the plasma application process.

Figures 19, 20:
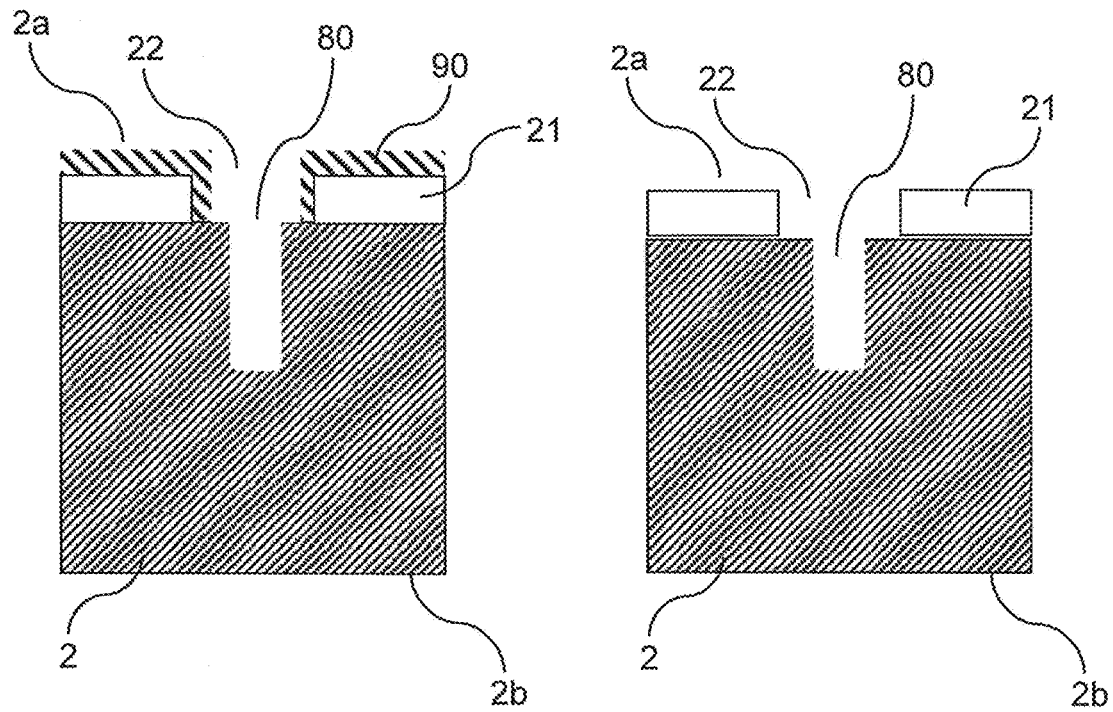
FIG. 19 is a cross-sectional view showing the outcome of the plasma application step illustrated in FIG. 18.
FIG. 20 is a cross-sectional view showing the outcome of a step of fully removing the plasma resistant coating according to the second embodiment of the method of the present invention.

The grooves 80 extend along only part of the thickness of the wafer 2, as is schematically shown in FIG. 19. For example, the grooves 80 may be formed so as to extend along 20% or more, 30% or more, 40% or more, 50% or more, 60% or more, 70% or more, 80% or more, or 90% or more of the thickness of the wafer 2.

After forming the grooves 80 in the wafer 2, the remainder of the plasma resistant coating 90 is removed from the front side 2*a*. The result of this removal step is shown in FIG. 20.

Alternatively, the remainder of the plasma resistant coating 90 may be removed at a later stage, e.g., after grinding the back side 2*b* of the semiconductor wafer 2.

Subsequently, the back side 2*b* of the semiconductor device wafer 2 is ground, e.g., by using the grinding apparatus 8 shown in FIG. 13. In the grinding process, the protective sheeting 5 (see FIGS. 6 and 7) may be used substantially in the same manner as detailed above for the method of the first embodiment.

Figure 21:
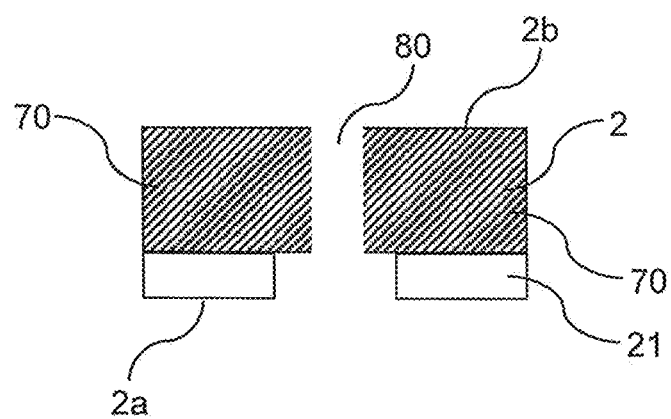
FIG. 21 is a cross-sectional view showing the outcome of a step of grinding the back side of the semiconductor device wafer according to the second embodiment of the method of the present invention.

The grinding step is carried out in such a way as to reduce the wafer thickness to a thickness that corresponds to the depth of the grooves 80 formed by plasma application. In this way, the wafer material which had not been reached by the plasma grooving process is removed in the grinding step, so that the wafer 2 is divided along the division lines 22 by the grinding process. The result of the grinding step, providing fully separated chips or dies 70, is shown in FIG. 21.

After grinding the back side 2*b* of the semiconductor device wafer 2, the ground back side 2*b* may be polished and/or etched, e.g., plasma etched. Also in this optional polishing and/or etching step, the protective sheeting 5 may be used.

In the methods according to the first and second embodiments described above, modified regions 23 were formed in the semiconductor device wafer 2. However, the method of the present invention may also be carried out by forming hole regions in the wafer 2, as has been explained in detail above. In particular, the hole regions comprise spaces in the wafer 2 which are open to one or both sides of the wafer 2. These spaces provide openings through which the plasma PL can enter into the wafer 2 in the plasma application step.

The invention claimed is:

1. A method of processing a substrate, having a first surface and a second surface opposite the first surface, wherein the substrate has on the first surface a device area with a plurality of devices partitioned by a plurality of division lines;

the substrate has a thickness in the direction from the first surface towards the second surface of 100 μm or more; and the method comprises:

applying a pulsed laser beam to the substrate, having a thickness of 100 μm or more, from the side of the first surface, wherein the substrate is made of a material which is transparent to the pulsed laser beam and the pulsed laser beam is applied to the substrate at least in a plurality of positions along each of the division lines, in a condition where a focal point of the pulsed laser beam is located at a distance from the first surface in the direction from the first surface towards the second surface, so as to form a plurality of modified regions in the substrate along each of the division lines;

grinding the second surface of the substrate to adjust the substrate thickness after forming the modified regions in the substrate, and after grinding the second surface of the substrate, applying a plasma at least to the ground second surface, wherein the substrate is divided along the division lines.

2. The method according to claim 1, further comprising, before and/or after applying the pulsed laser beam to the substrate from the side of the first surface:

applying a pulsed laser beam to the substrate, having a thickness of 100 μm or more, from the side of the second surface, wherein the pulsed laser beam is applied to the substrate at least in a plurality of positions along each of the division lines, in a condition where a focal point of the pulsed laser beam is located at a distance from the second surface in the direction from the second surface towards the first surface, so as to form a plurality of modified regions in the substrate along each of the division lines.

3. The method according to claim 1, further comprising, after grinding the second surface of the substrate:

applying a pulsed laser beam to the substrate from the side of the ground second surface, wherein the pulsed laser beam is applied to the substrate at least in a plurality of positions along each of the division lines, in a condition where a focal point of the pulsed laser beam is located at a distance from the ground second surface in the direction from the ground second surface towards the first surface, so as to form a plurality of modified regions in the substrate along each of the division lines.

4. The method according to claim 1, further comprising, after grinding the second surface of the substrate:

polishing and/or etching the ground second surface.

5. The method according to claim 1, wherein the modified regions comprise amorphous regions or regions in which cracks are formed, or the modified regions are amorphous regions or regions in which cracks are formed.

6. The method according to claim 1, wherein, in each of the plurality of positions along each of the division lines where the pulsed laser beam or the pulsed laser beams is or are applied, plural modified regions are formed, the plural modified regions being arranged next to one another along the direction from the first surface towards the second surface.

7. The method according to claim 6, wherein, in each of the plurality of positions along each of the division lines where the plural modified regions are formed, a distance between an uppermost modified region in the direction from the second surface towards the first surface and the first surface is in the range of 5 µm to 100 µm, and/or a distance between a lowermost modified region in the direction from the second surface towards the first surface and the second surface is in the range of 5 µm to 100 µm.

8. The method according to claim 1, further comprising, before and/or after applying the pulsed laser beam to the substrate from the side of the first surface:
applying a plasma resistant coating to the first surface.

9. The method according to claim 8, further comprising, after grinding the second surface of the substrate:
dividing the substrate along the division lines; and
applying a plasma at least to the first surface of the divided substrate.

10. A method of processing a substrate, having a first surface and a second surface opposite the first surface, wherein
the substrate has on the first surface a device area with a plurality of devices partitioned by a plurality of division lines; and
the method comprises:
applying a pulsed laser beam to the substrate from the side of the first surface or the side of the second surface, wherein the pulsed laser beam is applied to the substrate at least in a plurality of positions along each of the division lines so as to form a plurality of modified regions and/or a plurality of hole regions in the substrate along each of the division lines; and
after forming the modified regions and/or the hole regions in the substrate, applying a plasma to the substrate so as to form a plurality of grooves in the substrate extending along the division lines where the plurality of modified regions and/or the plurality of hole regions has been formed,
wherein, by forming the plurality of modified regions and/or the plurality of hole regions in the substrate along each of the division lines, a plurality of openings is formed in the substrate along each of the division lines, each opening being open to the side of the surface of the substrate from which the pulsed laser beam is applied or being open to the side of the surface of the substrate which is opposite to the side of the surface of the substrate from which the pulsed laser beam is applied,
wherein further the plasma is applied to the side of the surface of the substrate to which the openings formed in the substrate along each of the division lines are open.

11. The method according to claim 10, wherein
the pulsed laser beam is applied to the substrate from the side of the first surface, and
the pulsed laser beam is applied to the substrate in a condition where a focal point of the pulsed laser beam is located on the first surface or a focal point of the pulsed laser beam is located at a distance from the first surface in the direction from the first surface towards the second surface or a focal point of the pulsed laser beam is located at a distance from the first surface in the direction opposite to the direction from the first surface towards the second surface.

12. The method according to claim 10, wherein
the pulsed laser beam is applied to the substrate from the side of the second surface, and
the pulsed laser beam is applied to the substrate in a condition where a focal point of the pulsed laser beam is located on the second surface or a focal point of the pulsed laser beam is located at a distance from the second surface in the direction from the second surface towards the first surface or a focal point of the pulsed laser beam is located at a distance from the second surface in the direction opposite to the direction from the second surface towards the first surface.

13. The method according to claim 10, wherein the pulsed laser beam and the plasma are applied to the substrate from the same side of the substrate or from opposite sides of the substrate.

14. The method according to claim 10,
wherein the modified regions comprise amorphous regions or regions in which cracks are formed, or the modified regions are amorphous regions or regions in which cracks are formed, and/or
wherein each of the hole regions is composed of a modified area and a space in the modified area open to the side of the surface of the substrate from which the pulsed laser beam is applied.

15. The method according to claim 10, wherein the grooves formed in the substrate by applying the plasma to the substrate extend along the entire thickness of the substrate, so that the substrate is divided along the division lines by applying the plasma to the substrate.

16. The method according to claim 10, wherein, in each of the plurality of positions along each of the division lines where the pulsed laser beam is applied, plural modified regions are formed, the plural modified regions being arranged next to one another along the thickness direction of the substrate.

17. The method according to claim 10, further comprising grinding the second surface of the substrate to adjust the substrate thickness before and/or after forming the modified regions and/or the hole regions in the substrate.

18. The method according to claim 17, wherein grinding the second surface of the substrate is performed after forming the modified regions and/or the hole regions in the substrate and before and/or after applying the plasma to the substrate.

19. The method according to claim 18, wherein the grooves formed in the substrate by applying the plasma to the substrate extend along only part of the thickness of the substrate, grinding the second surface of the substrate is performed after applying the plasma to the substrate, and the substrate is divided along the division lines by grinding the second surface of the substrate.

20. The method according to claim 10, wherein the substrate is a single crystal substrate or a glass substrate or a compound substrate or a polycrystalline substrate.

* * * * *